US006349029B1

(12) United States Patent
Leman et al.

(10) Patent No.: US 6,349,029 B1
(45) Date of Patent: Feb. 19, 2002

(54) COMPUTER COMPONENT SECURITY APPARATUS AND METHOD

(75) Inventors: Michael V. Leman, Eagle; Gregory P. Johnson, Boise, both of ID (US); Jacques Gagne, Los Altos, CA (US); Philip Hartley, San Francisco, CA (US); Ray Gradwohl, Saratoga, CA (US)

(73) Assignee: MicronPC, LLC, Nampa, ID (US)

( * ) Notice: Subject to any disclaimer, the term of this patent is extended or adjusted under 35 U.S.C. 154(b) by 0 days.

(21) Appl. No.: 09/422,041

(22) Filed: Oct. 20, 1999

(51) Int. Cl.[7] .............................. G06F 1/16; H05K 7/14
(52) U.S. Cl. ...................... 361/683; 361/610; 361/725; 312/223.1; 248/552; 70/14; 70/32; 70/57; 16/221; 16/342
(58) Field of Search .................................. 361/679–686, 361/724–727, 610; 248/552, 553; 312/223.1–223.3; 70/14, 57, 58, 32–34; 16/221, 368, 308, 341, 342

(56) References Cited

U.S. PATENT DOCUMENTS

| 4,268,100 A | * | 5/1981 | Kekas et al. ................. 361/725 |
| 5,032,952 A | | 7/1991 | Cooke et al. ................ 361/392 |
| 5,172,305 A | | 12/1992 | DeWilde ..................... 361/415 |
| 5,305,183 A | | 4/1994 | Teynor ........................ 361/686 |
| 5,495,389 A | | 2/1996 | Dewitt et al. ................ 361/683 |
| 5,555,489 A | | 9/1996 | Keskinen .................... 361/683 |
| 5,661,631 A | * | 8/1997 | Crane, Jr. .................... 361/683 |
| 5,666,264 A | * | 9/1997 | Chandler et al. ............ 361/683 |
| 5,684,671 A | | 11/1997 | Hobbs et al. ................ 361/683 |
| 5,701,231 A | | 12/1997 | Do et al. ..................... 361/683 |
| 5,743,606 A | | 4/1998 | Scholder ................... 312/223.2 |
| 5,745,342 A | | 4/1998 | Jeffries et al. .............. 361/683 |
| 5,761,034 A | | 6/1998 | Chu ............................ 361/687 |
| 5,764,480 A | | 6/1998 | Crump et al. ............... 361/685 |
| 5,774,337 A | * | 6/1998 | Lee et al. .................... 361/725 |
| 5,777,848 A | | 7/1998 | McAnally et al. .......... 361/725 |
| 5,784,251 A | | 7/1998 | Miller et al. ................ 361/683 |
| 5,973,918 A | * | 10/1999 | Felcman et al. ............ 361/683 |
| 5,995,364 A | * | 11/1999 | McAnally et al. .......... 361/685 |
| 6,097,591 A | * | 8/2000 | Ircha ........................... 361/683 |

* cited by examiner

*Primary Examiner*—Leo P. Picard
*Assistant Examiner*—Lisa Lea-Edmonds
(74) *Attorney, Agent, or Firm*—Trop, Pruner & Hu, P.C.

(57) ABSTRACT

The present invention provides for an apparatus and method for securing a computer component in a computer system. Some embodiments include single or multiple panels hinged to a chassis of the computer system. A panel of some embodiments may carry or otherwise secure components of the computer system. One such component that may be carried by a panel is a computer power supply.

23 Claims, 18 Drawing Sheets

COMPUTER COMPONENT SECURITY APPARATUS AND METHOD

RELATED APPICATIONS

This application is related to U.S. application Ser. No. 09/422,044, entitled "PROCESSOR AND CIRCUIT BOARD RETAINING APPARATUS AND METHOD"; U.S. application Ser. No. 09/422,043, entitled "EXPANSION BOARD AND CIRCUIT BOARD RETAINING APPARATUS AND METHOD"; and U.S. application Ser. No. 09/422,144, entitled "COMPUTER COOLING SYSTEM AND METHOD"; all filed on Oct. 20, 1999.

TECHNICAL FIELD

The present invention is directed toward an apparatus and method for securing a computer component in a computer system. More particularly, embodiments of the invention employ a unique panel useful to secure a computer component relative to a chassis of the computer system.

BACKGROUND OF THE INVENTION

Three advantageous features of a computer system are: that the system be relatively easy to manufacture; that components of the system be easily accessible for maintenance purposes; and that the system be manufactured from standard components. Computer systems that provide improved manufacturability and maintainability have often been built with specially manufactured components that fit and operate together to give enhanced access to the interior of the system. However, relatively small numbers of several specially manufactured components are more expensive than standard components that are more widely available from multiple sources. A challenge of an improved computer system then is to provide an arrangement of standard components that is relatively easy to manufacture and maintain.

A typical computer system has a chassis that supports and encases a number of components of the computer system. The primary electrical interconnect component of a computer system is a backplane circuit board, such as a motherboard, that serves as a platform to which other components of the computer system may be connected. A motherboard primarily connects to one interior surface of the chassis in a plane parallel to the plane of the one interior surface. The motherboard typically has a number of sockets, slots, and plugs with which other circuit boards with components and other components with plugs may be connected to form electrical, and in some cases, mechanical connections between the circuit boards and components and the motherboard. Examples of circuit boards with components that may be plugged into the motherboard include one or more central processing units, main memory cards, video adapter cards, video acceleration cards, sound cards, SCSI controller cards, parallel or serial interface cards, game adapter cards, network cards, and others. Circuit boards with components such as these may connect with a motherboard through connectors along one edge of the circuit board. The edge connectors plug directly into a slot or socket in the motherboard. When attached in this manner, the circuit board may be substantially perpendicular to the motherboard. Examples of components with wires connected to plugs that may be plugged into the motherboard include hard disk drives, removable media disk drives, keyboards, pointing devices, printers, scanners, external modems, and others.

A computer system as described above can physically be viewed as a layered system. The base layer is the chassis. On top of the chassis is the motherboard layer. Above the motherboard is a layer of components, some of which mechanically and electrically connect to the motherboard through slots or sockets, and some that electrically connect through flexible wires with plugs. Some of the components may have an additional layer of component securing apparatuses for physically attaching components to the motherboard. Some systems may include cooling fans as an additional layer adjacent to components for cooling the components. While the prior art provides each of these layers, the prior art does not provide for the degree of use of standard components, for the ease of manufacturability, or for the ease of accessibility for maintenance that an improved device would provide.

A number of prior art systems provide enhanced access to underlying layers of a computer system through the use of hinged portions of the computer system. For example, the systems of U.S. Pat. Nos. 5,495,389, 5,701,231, 5,761,034, and 5,784,251 make system layers separable about hinges to provide access to components within the systems. The systems of U.S. Pat. Nos. 5,032,952, 5,172,305, and 5,777,848 provide enhanced access to some components by making power supplies of the computer systems partially removable about hinges. A primary failing of each of these seven systems is that they fail to allow use of standard motherboards, components, and chassis configurations. Some of the hinged power supply art does allow for use of some standard components such as standard power supplies. However, an improved system would not only provide an ability to easily remove the power supply layer, but other layers of the same system such as the component layer and the component securing layer.

One component that must be securely retained on the motherboard of a computer system is the central processing unit, or processor. A processor is often resident on a circuit board. The circuit board and processor together may be referred to below as a processor package. The Intel Corporation P6-based processor packages, for example, connect to the motherboard through what is known as Slot 1 or Slot 2 connectors. A Slot 1, or 242-contact slot connector, is used with PENTIUM II, PENTIUM III, or CELERON processor packages. The Slot 2, or 330-contact slot connector, is used with XEON processor packages. Slot 1 and Slot 2 electrical connectors are not, however, adequate to secure a processor package to a motherboard under normal service loads. Therefore, mechanical retaining structures must be added around a Slot 1 or Slot 2 connector to secure the processor package to the motherboard. A typical mechanical retaining structure is known as a "goal post" because it physically resembles a football goal post with two vertical uprights. See FIG. 8 illustrating goal post "GP" and uprights "UR" supporting a PENTIUM II or PENTIUM III processor package. Each of the vertical uprights is positioned to support a vertical edge of a processor package that may be supported in the connector. Support along the vertical edges, however, has not proven adequate to support the processor package. Similarly, a CELERON processor package is illustrated in FIG. 9.

To adequately support various Slot 1 and Slot 2 processor packages, a number of specialized retaining structures have been developed. For instance, U.S. Pat. Nos. 5,726,865 and 5,642,263 disclose such structures. A problem with these structures, as well as with the goal posts, is that they add expense to the computer system. Not only do the parts themselves add cost, but also installing the parts adds time to the manufacturing process.

The prior art processor package securing mechanisms have a number of other shortcomings. The mechanisms are designed to only secure a single processor package per mechanism. An improved mechanism could secure a single processor package or dual processor packages. An improved mechanism would also provide improved lateral support as well as vertical support to the processor packages. Lateral support would prevent side-to-side movement of the processor package and prevent the processor package from working loose under service loads. An improved mechanism would provide quicker release of a processor package or packages when desired by an operator. Easier access would allow for shorter manufacturing and maintenance times.

As discussed above, computer systems often include other components on circuit boards, in addition to processors, that connect to a motherboard through sockets or slots. One type of component on a circuit board is often referred to as an expansion board. Expansion boards include such circuit board types as peripheral component interconnect (PCI) boards, industry standard architecture (ISA) boards, and video adapter boards. Expansion boards allow additional circuits, and therefore additional functionality, to be added to computer systems. It is a standard practice to mount expansion boards substantially perpendicular to the motherboard.

Because expansion boards are not soldered into place on the motherboard, it is possible that the boards will become dislodged, lose electrical connectivity, and cease to function properly in shipping or under normal service loads. A number of designs have been proposed to adequately secure expansion boards to the motherboard. The standard configuration uses one screw per expansion board to secure one side of a mounting plate to the chassis of a computer. The mounting plate is secured to the expansion board. The other end of the mounting plate is inserted into a slot in the chassis. The expansion board is thus fastened relative to one wall of the computer chassis. This design assumes that the chassis is adequately stiff to prevent the motherboard, which is attached to one wall of the chassis, and the expansion board, which is attached to a second wall of the chassis, from moving relative to one another.

Expansion boards, however, often become dislodged from the motherboard even though fastened to one side of the computer chassis. Expansion boards are particularly susceptible to becoming dislodged when the board is located away from a wall of the chassis. When a board is located away from the wall of the chassis, that is, near the middle of the computer box, there is a lack of lateral stiffness in the wall of the chassis to which the motherboard is connected. Therefore, flexing of the chassis wall to which the motherboard is connected through a slot causes relative movement between the motherboard and the expansion board. Consequently, shaking of the computer or flexing of the chassis during shipping or handling can result in disconnection of expansion boards from the motherboard. Disconnection is also possible with computers used in non-stationary applications.

It can be a major inconvenience to a computer user when an expansion board is dislodged. For a user unfamiliar with the symptoms of the problem, it appears that the computer is materially defective. Even after the problem is identified, it is inconvenient and time consuming to partially disassemble the computer and re-seat the expansion boards. The superior alternative is to prevent the expansion boards from ever becoming dislodged from the motherboard.

The problem of expansion boards becoming unseated has been addressed by the prior art. For example, in U.S. Pat. No. 5,603,628 a pair of straps is used to hold a circuit board in a connector slot. A problem with the '628 patent design is that the straps pass over and through the components of the board. Therefore, there is a possibility of damage to the board and the components of a board during installation or adjustment of the straps. Additionally, the '628 patent requires that connection anchors be added to the connector slot. The anchors not only broaden the connector slot and consume motherboard area, but also require special manufacturing. The specific problem of expansion board retention in a personal computer was addressed in U.S. Pat. No. 5,715,146. However, the '146 patent requires separate size adapter members to adequately secure expansion boards of differing heights. For each height of expansion board, a different size adapter must be added to the post member that supports the board. With different size adapters, production costs are increased and the possibility of manufacturing errors increases.

The prior art fails to provide an economical expansion board retention system that does not interfere with the components of the expansion board or consume motherboard area. Under the prior art, numerous adapters of varying sizes may be required to compensate for the fact that expansion boards are not uniform in height. Consequently, there is a need for an apparatus and method that adequately secures expansion boards to a motherboard without interfering with the components of the expansion board or the components of the motherboard. An improved device would also provide ease and speed of adjustment in retaining expansion boards.

As mentioned above, some components in a computer system require an additional cooling component such as a heat sink and/or a fan to properly dissipate the heat generated in portions of the computer system. An illustrative heat sink and fan combination of the prior art is disclosed in U.S. Pat. No. 5,309,983. The fan of the '983 patent is, however, a miniature fan and therefore less capable of moving larger amounts of air as may be required to properly cool components of some computer systems. The miniature fan is also less common and therefore tends to be more expensive than a standard computer system cooling fan.

The need for heat dissipation capabilities is presently a concern and is becoming an even greater concern for future systems. In a Cahners EDN magazine article entitled "Keeping HAL cool in 2003," Oct. 8, 1998, pp. 50–58, it was predicted through computer simulations based on projected power dissipations of computer components that, absent enhanced cooling solutions, hot spots of up to 493° C. would occur in typical computer systems by the year 2003. Solutions to the problem where based on the addition of cooling fans and the management of air flow. The solution suggested by EDN is to put an active heat sink/fan similar to the one in the '983 patent on the processor, and to put a fan on a wall of the chassis adjacent to the PCI card area. The solution applied to the processor is not very cost effective; however, since it requires the use of a more expensive active heat sink with a miniature fan. The problem with the suggested fan adjacent to the PCI card area is that either access to external plug portions of the PCI cards would be blocked by the fan placement or the fan would block drive bays in present day computer systems. Therefore, the EDN article identifies the problem thermal areas, but does not suggest practical solutions.

A better solution would provide for cooling air to pass over both the processor heat sink and the PCI cards without blocking access to either area when access is needed. Furthermore, an improved solution would employ standard cooling fans and cooling components to further reduce the cost of implementation. An improved solution would provide easy access to cooling components and would allow for maintenance on the components without the use of tools.

Another need that has not been met by the prior art is a standard system that provides for placement of various combinations of standard fans over critical areas. Computer systems have different cooling needs depending on the components included in the particular system. For example, a system with four high speed PCI cards and two high speed processors may need dedicated fans over both the PCI cards and the processors, and standard system exhaust fans. A system with only one expansion board and an older model or single processor may only need a standard exhaust fan to adequately cool all system components. An improved system would allow tuning of the airflow in the system by use of various combinations of fans.

SUMMARY OF THE INVENTION

One embodiment of the invention is a panel attached to a computer chassis through a hinge. The panel is for supporting components of a computer system. The panel has an upper portion with a first hinge along a first edge, and a lower portion with a second hinge along a first edge of the lower portion. The lower portion may be detached from or interconnected with the upper portion. The panel also may include a first lock mechanism for securing a second edge of the panel relative to the computer chassis. The long dimension of the second edge of said panel is substantially perpendicular to the axes of the first and second hinges.

Another embodiment of the invention is a component securing apparatus having a computer chassis, a panel, and a component. The panel is for supporting the component. The panel has an upper portion with a first hinge along a first edge, and a lower portion with a second hinge along a first edge of the lower portion. The lower portion may be detached from or interconnected with the upper portion. The panel also may include a first lock mechanism for securing a second edge of the panel relative to the computer chassis. The long dimension of the second edge of said panel is substantially perpendicular to the axes of the first and second hinges.

Still another embodiment of the invention is a method of securing a computer component in a computer system. An act of the method is to open a hinged panel coupled along an edge of a computer system. Another act is to insert a first computer component into the computer system and then to couple a second computer component to the hinged panel. The hinged panel may then be closed to secure the first computer component in the computer system, and to position the second computer component at an operational location in the computer system.

DETAILED DESCRIPTION OF THE INVENTION

Panel

Figure 1:
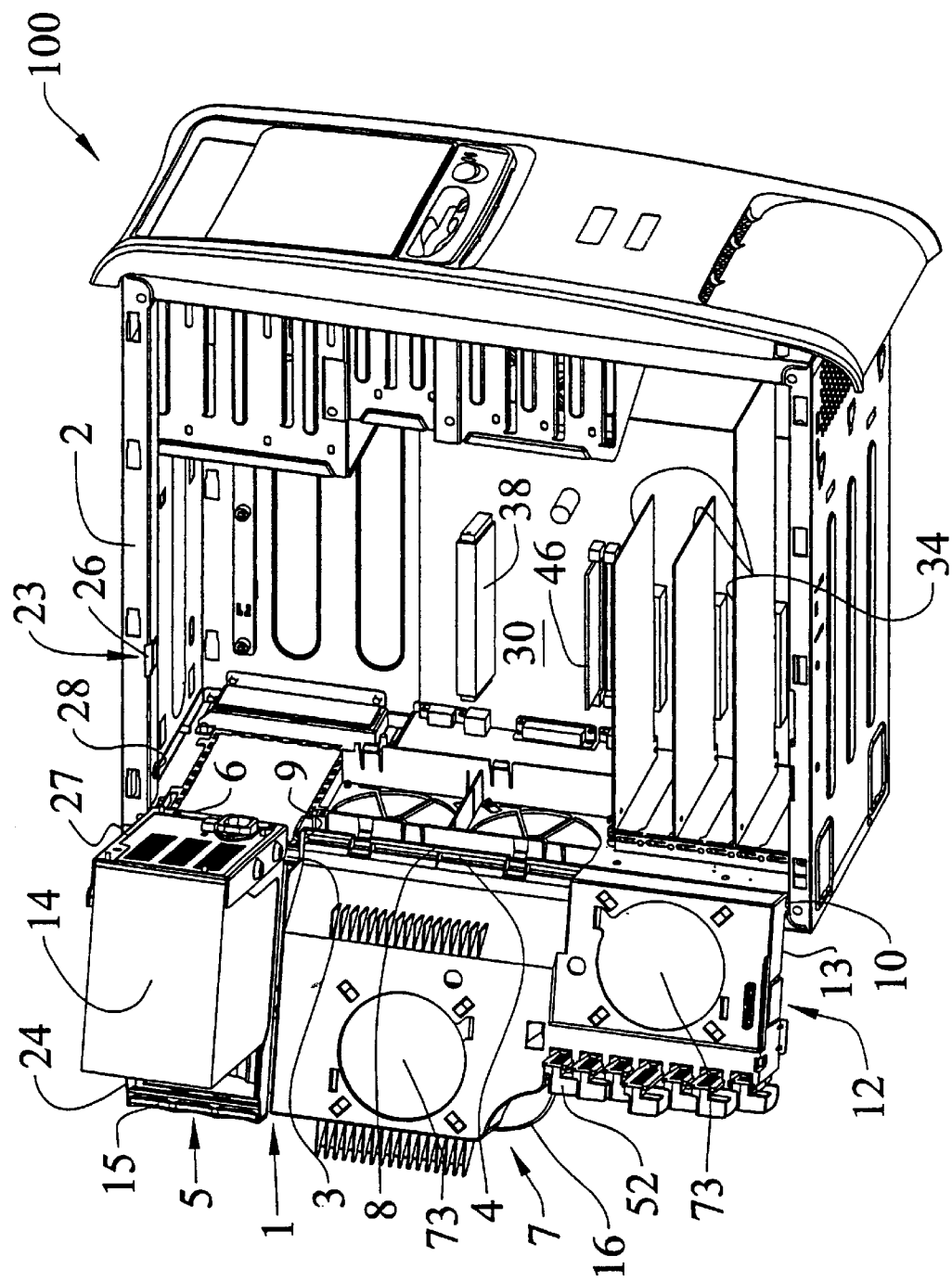
FIG. 1 is a perspective view of an embodiment of the computer system of the present invention with panel portions in an open position.
Figure 3:
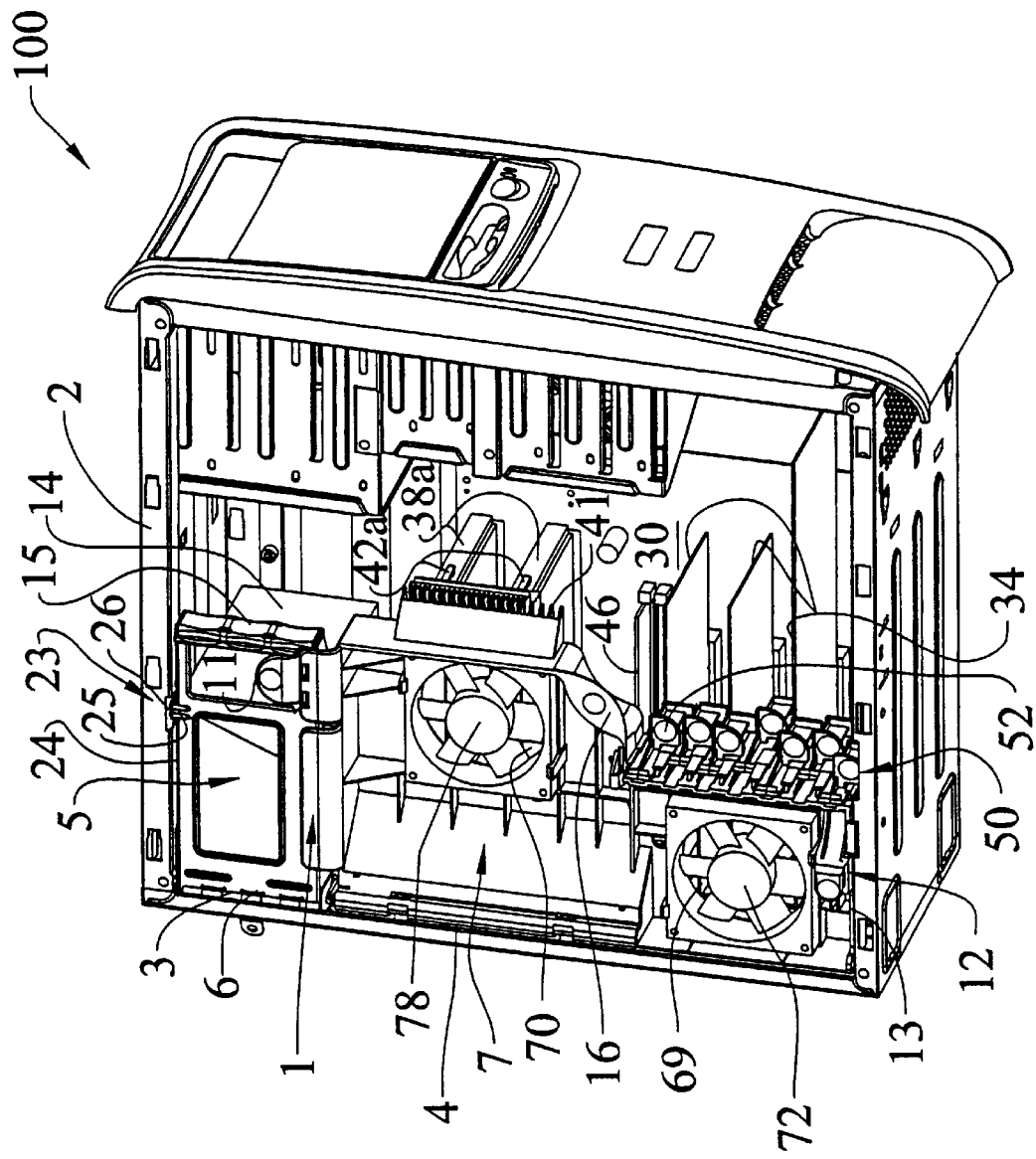
FIG. 3 is a perspective view of the embodiment of the computer system of FIG. 2 in a closed position.

As illustrated in FIG. 1, embodiments of the present invention are directed toward a panel 1 attached to a computer chassis 2 through a hinge or hinges such as first hinge 3 and second hinge 4. The panel 1 is for supporting components of a computer system 100. The panel 1 has an upper portion 5 with the first hinge 3 along a first edge 6 of the upper portion 5. The panel 1 also has a lower portion 7 with a second hinge 4 along the first edge 8 of said lower portion 7. As illustrated, the second hinge 4 is formed by an upper pin 9 and a lower pin 10 connected through structural elements of the lower portion 7. The upper pin 9 and the lower pin 10 provide pivot points about which the lower panel 7 hinges with the chassis 2. Other types of hinges and hinged connections such as the first hinge 3 would serve equally well in connecting the lower portion 7 with the chassis 2. Likewise, various styles of hinges may be used in the position of the first hinge 3. The axis of the second hinge 4 is oriented along an axis substantially parallel with the axis of the first hinge 3. The lower portion 7 may be detached from or connected with the upper portion 5. In some embodiments, such as is shown in FIG. 3, the lower portion 7 is connected with the upper portion 5 through a hook catch 11. Hook catch 11 is better illustrated in FIG. 4 and more thoroughly described below.

As may be seen in FIGS. 1 and 3, the panel 1 also includes a first lock mechanism 12 for securing a second edge 13 of the panel 1 relative to the computer chassis 2. The first lock mechanism 12 is illustrated in more detail in FIG. 5, and is also more thoroughly described below. The longest dimension of the second edge 13 is substantially perpendicular to the axes of the first and second hinges 3 and 4.

A component that may be supported by the panel 1 is a power supply 14 as shown in FIG. 3. As illustrated, the power supply 14 is supported by the upper portion 5 of the panel 1. The power supply 14 is merely illustrative of the types of components that may be supported by the panel 1. Any type of component typically found interior to a computer chassis 2 could be supported by the panel 1.

The upper portion 5 may also include a handle 15 for lifting and rotating the upper portion 5 relative to the computer chassis 2, as shown in FIG. 1. The handle 15 also includes texturing to demonstrate to a user that the handle 15 is intended to be gripped. As illustrated in FIG. 3, similar demonstrative texturing is applied to the hook catch 11 and a tab 16 of the lower portion 7 in order to show users which parts of the invention are intended to be gripped.

Figure 4:
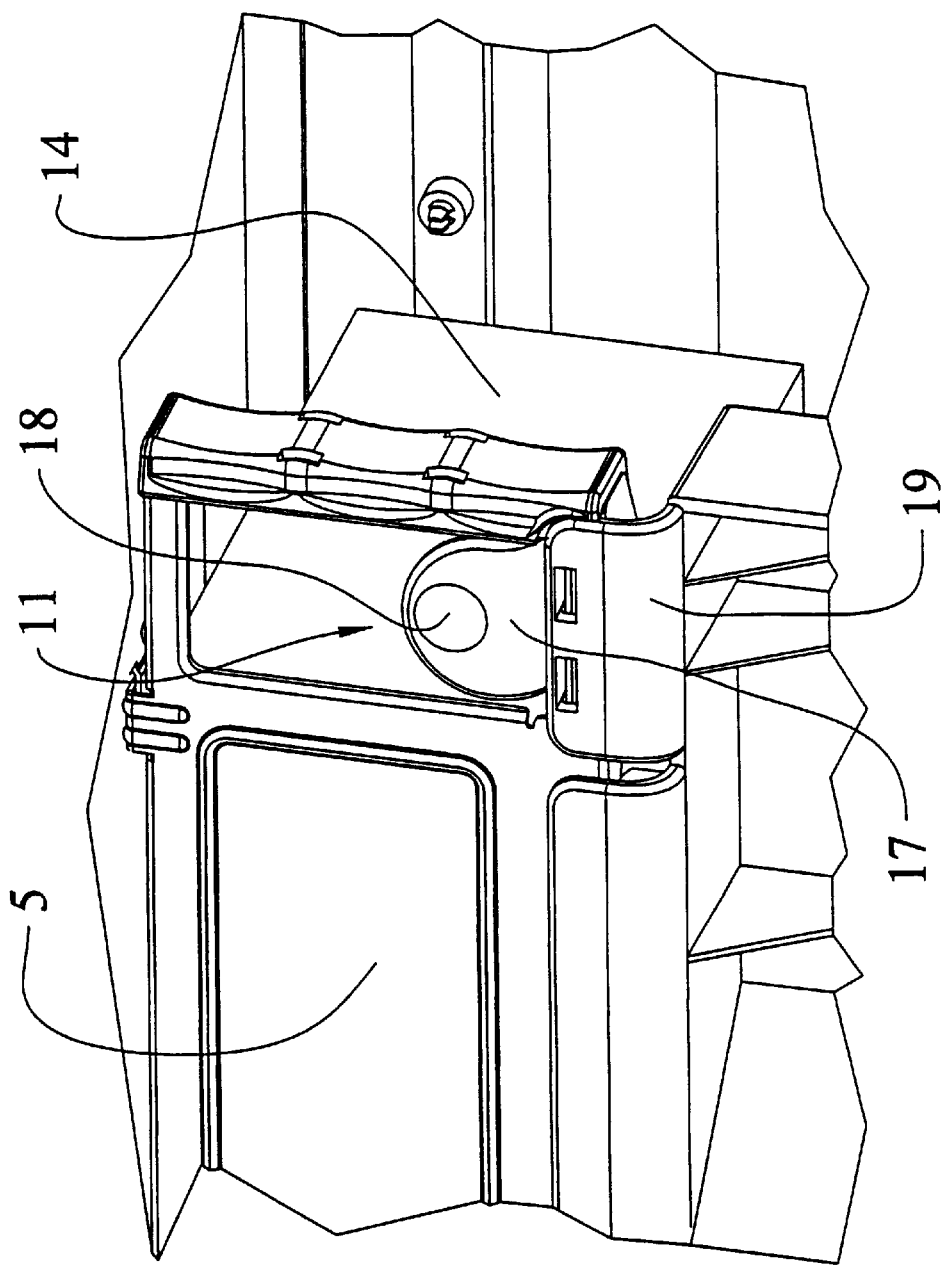
FIG. 4 is a perspective view of the hook catch of an embodiment of the present invention.

The hook catch 11 on the lower portion 7 is for interconnecting the lower portion 7 to the upper portion 5 is best illustrated in FIG. 4. The hook catch 11 includes a lifting tab 17 for lifting to disengage the hook catch 11 from the upper portion 5. When the first lock mechanism 12 is disengaged from the chassis 2, the hook catch 11 is operable in the following manner. An operator may place a thumb in the textured detent 18 or on curved edge 19 the lifting tab 17 toward the operator. By doing so the hook catch 11 is flexed about curved edge 19 and thereby released from the upper portion 5. Upper portion 5 may then also be accessible to be rotated as described above.

Figure 5:
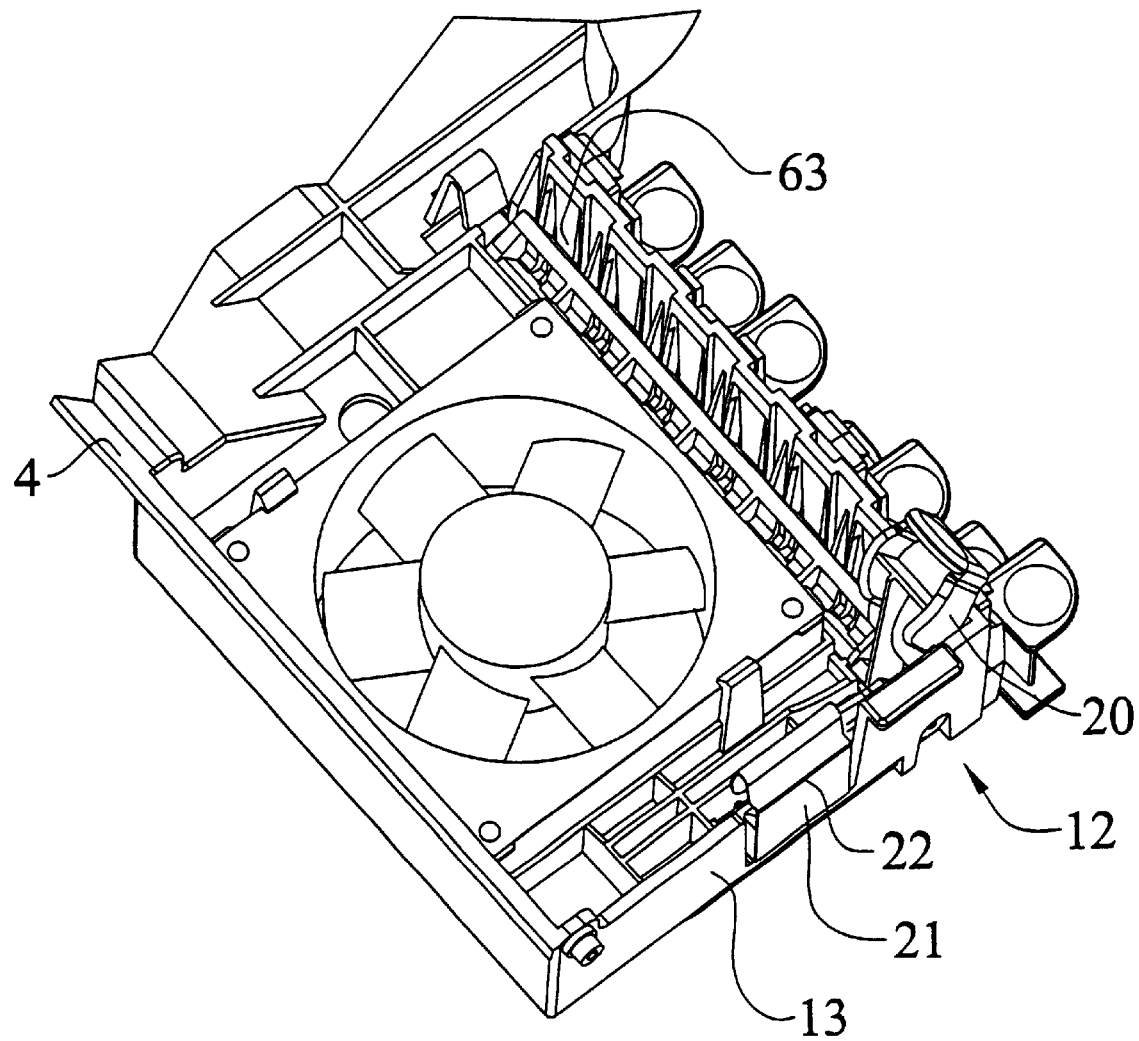
FIG. 5 is a perspective view of part of the lower portion of the panel of an embodiment of the present invention.

The first lock mechanism 12 is illustrated in detail in FIG. 5. The first lock mechanism 12 has a designator 20 that may be moved between a first position and a second position. As shown in FIG. 5 designator 20 is in the first position. The first lock mechanism 12 also includes a locking tab 21 that may be displaced by the designator 20 to engage the computer chassis 2 and restrict movement of the panel relative to the computer chassis when the designator 20 is in the second position. The designator 20 is shown in the second position in FIG. 6. The designator 20 and the locking tab 21 restrict movement of the panel by forcing a corner 22 of the locking tab 21 beneath a portion of the chassis 2 when the designator 20 is moved to the second position. The locking tab 21 is biased to flex toward the designator 20 such that when the designator 20 is moved to the first position the locking tab 21 springs beyond interference with the chassis 2 and the first lock mechanism is disengaged.

As illustrated in FIG. 3, the panel 1 may also include a second lock mechanism 23 for securing a third edge 24 of the panel 1 relative to the computer chassis 2. The third edge 24 is located opposite from the second edge 13. As illustrated in FIGS. 1 and 3, the second lock mechanism may consist of a tab 25 for engaging with a hole 26 in the computer chassis 2.

As illustrated in FIG. 1, the upper portion 5 includes a side 27 extending from the primary plane of the panel 1 such that two sides of a computer component, such as power supply 14, are contacted by the upper portion 5 when the computer component is supported by the upper portion 5. In this configuration, additional strength and stability are added to the support of the computer component by the upper portion 5 of the panel 1. The power supply 14 may also be attached to the back wall of the computer chassis 2 by a fastener passing through the back wall and into the power supply 14 or the side 27 when the upper portion 5 is closed as shown in FIG. 3.

As illustrated in FIG. 1, a component, such as the power supply 14, is removable from the computer chassis 2 by rotating the panel 1 out of the chassis 2. This functionality provides significant operational advantage. As can easily be seen in FIG. 1, the internal components of the computer system 100 are freely accessible when the panel 1 is rotated open. At the same time, components may be quickly and accurately returned there proper positions within the system merely by rotating the panel 1 to a closed position as is illustrated in FIG. 3.

Figure 7:
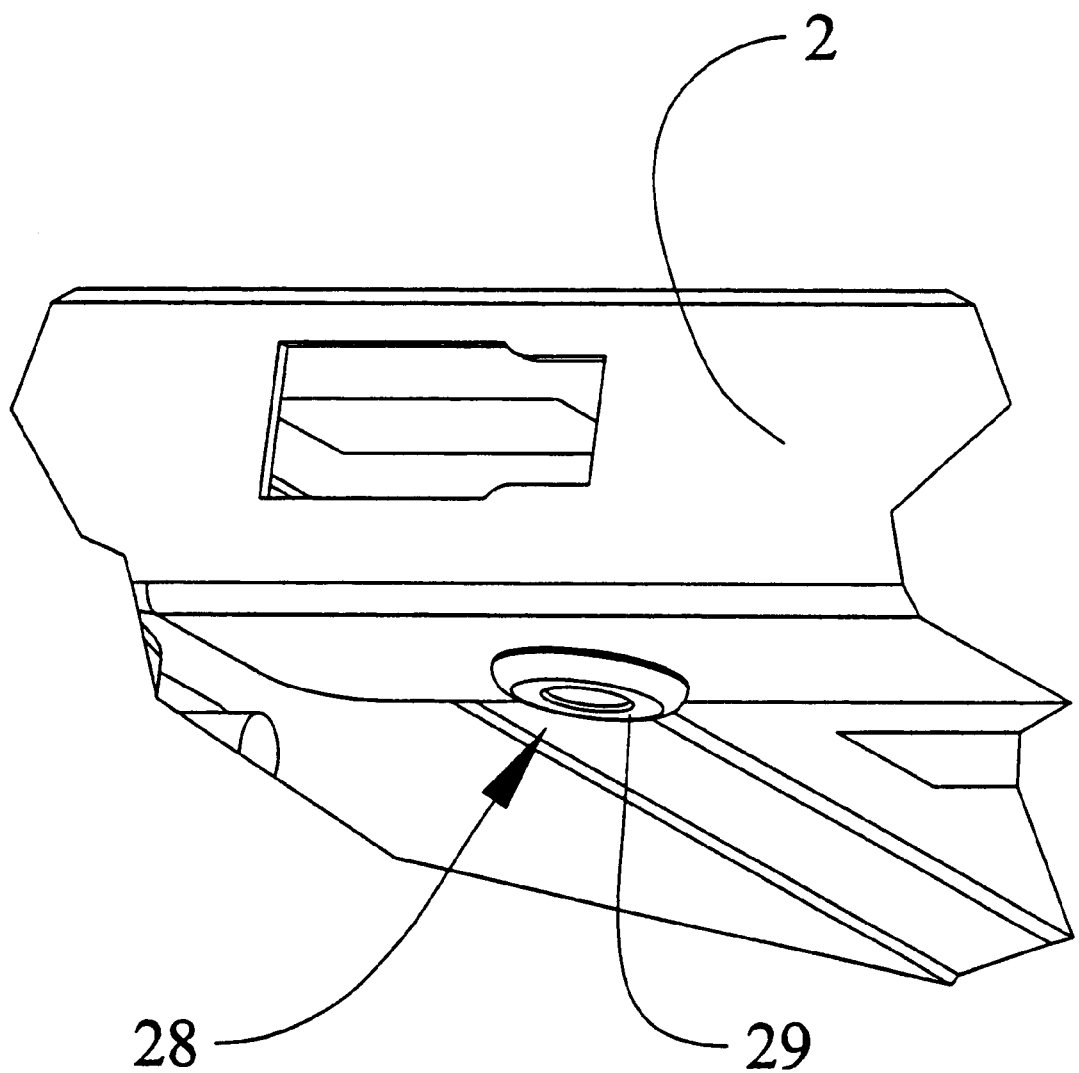
FIG. 7 is a perspective view of an embodiment of the grommet of the invention coupled to the computer chassis.
Figure 8:
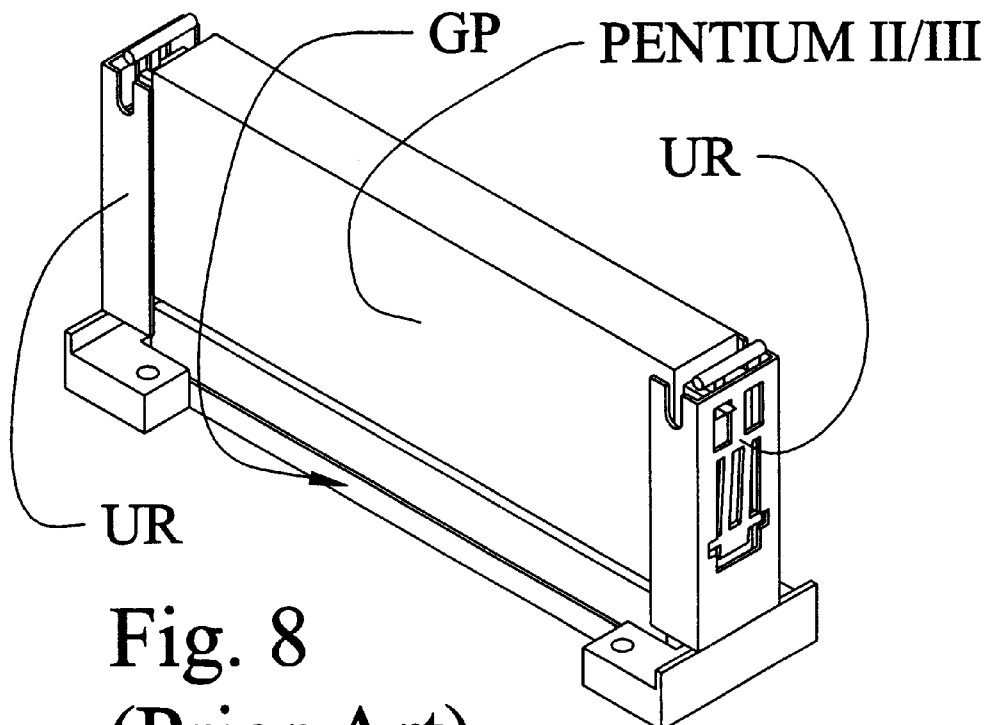
FIG. 8 is a perspective view of prior art goal posts supporting an Intel Corporation PENTIUM II or PENTIUM III processor package.
Figure 9:
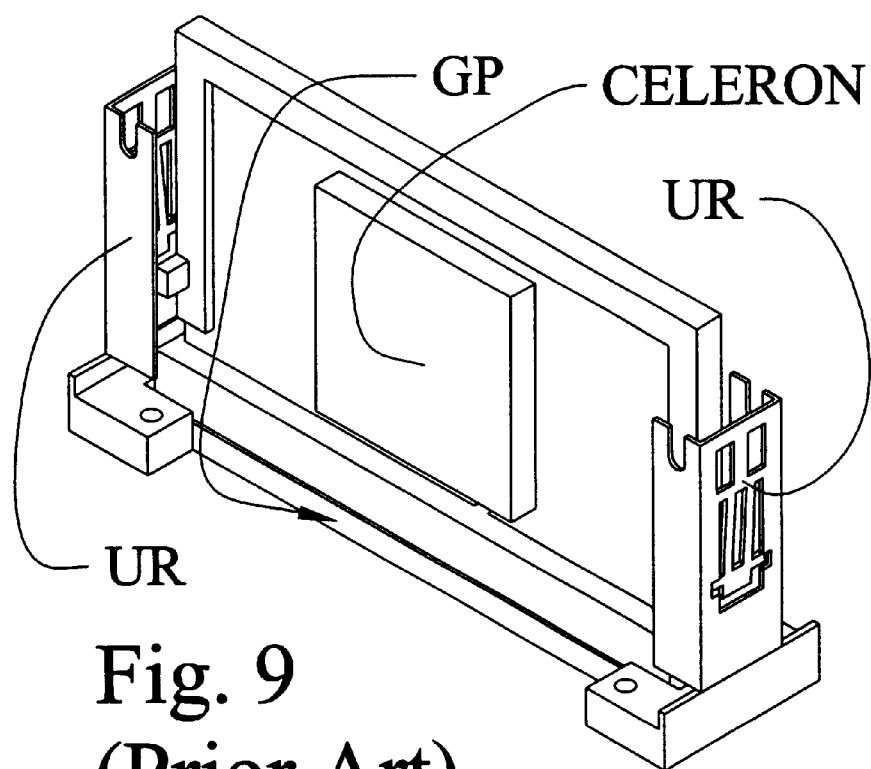
FIG. 9 is a perspective view of prior art goal posts supporting an Intel Corporation CELERON processor package.
Figure 10:
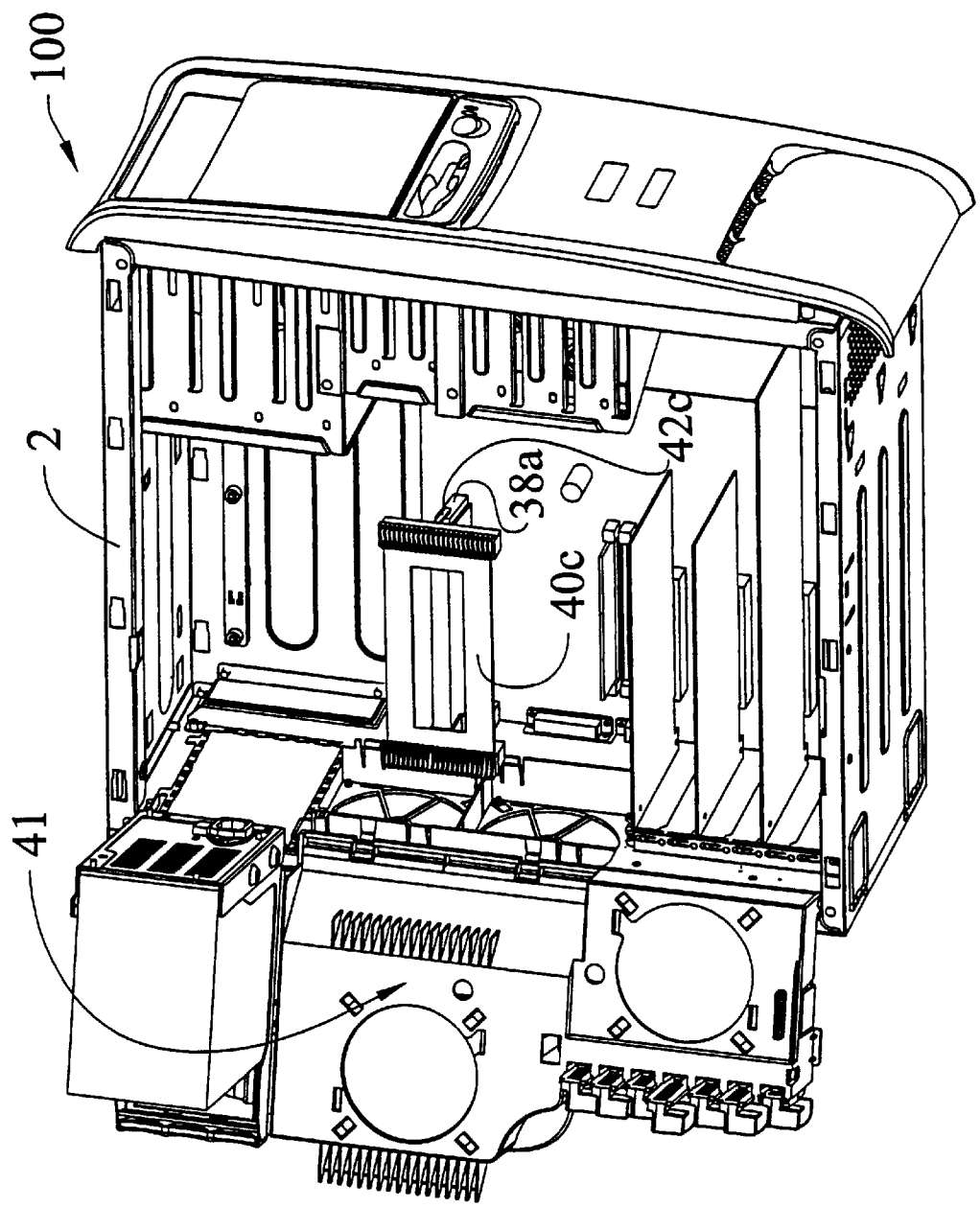
FIG. 10 is a perspective view of an embodiment of the computer system of the present invention with panel portions in an open position.

The computer component securing apparatus may also include a grommet 28 as illustrated in FIG. 1, and as illustrated in more detail in FIG. 7. The grommet 28 is coupled to the computer chassis 2 and is for engaging the panel 1 through frictional contact. The upper portion 5 of the panel 1 may be engaged with the grommet 28 as the upper portion 5 is moved toward a closed position. By engaging the upper portion 5, the upper portion 5 is restricted from moving freely relative to the computer chassis 2. This restriction helps to prevent damage to the panel 1 or to a component held in the panel. The restriction also helps to prevent injury of an operator by a falling panel 1 or a component held in the panel. The grommet 28 may be made from an elastometric material such as rubber. The grommet 28 has a face 29 for engaging with the panel 1. The opposite end (not shown) of the grommet 28 includes a connecting device that may be press fit into the computer chassis 2. The design of the grommet 28 is superior to other prior art solutions due to its simplicity. While the grommet 28 has a limitation in that it is only operable for a limited number of cycles, a computer system typically is not accessed more than this limited number of cycles. Therefore, prior art solutions merely add cost and complexity without adding functional benefit.

As illustrated in FIG. 1, the computer system 100 may include a motherboard 30 coupled to the computer chassis 2. A computer component, such as the power supply 14, may be coupled to the motherboard 30 through a cable (not shown for clarity). Cables between a power supply and a motherboard are well known to those skilled in the art and are not further described here. In other embodiments, a component may be directly secured to the motherboard 30 when the panel 1 is in a closed position, as shown in FIG. 3, and remove from the computer chassis 2 when the panel 1 is in an open position, as shown in FIG. 1. As is described in detail above, such a computer component may be locked into the computer system at an operational location such as is illustrated in FIG. 3.

One embodiment of the invention is a method of securing a computer component in the computer system 100 by use of the panel 1. In applying the method, a manufacturer, operator, or person providing service to the computer would open the panel 1 that is coupled along an edge of the computer system 100. Another act of the method maybe to insert a first computer component into the computer system. As illustrated in FIG. 1, the inserted component could be a motherboard 30. The first computer component could also be a component such as a circuit board and central processing unit 38 of a processor package, or an expansion board 34. In another act of the method, a second computer component, such as the power supply 14, may be coupled to the hinged panel 1. Still another act of the method is to close the hinged panel 1. In closing the hinged panel 1, as illustrated in FIG. 3, one or more of the first computer components can be secured in the computer system 100. Additionally, closing the panel 1 can position the second computer component at an operational location in the computer system 100. Through the use of such a panel, therefore, multiple securing and positioning functions may be accomplished through a single mechanism.

Processor Retainer

Figure 2:
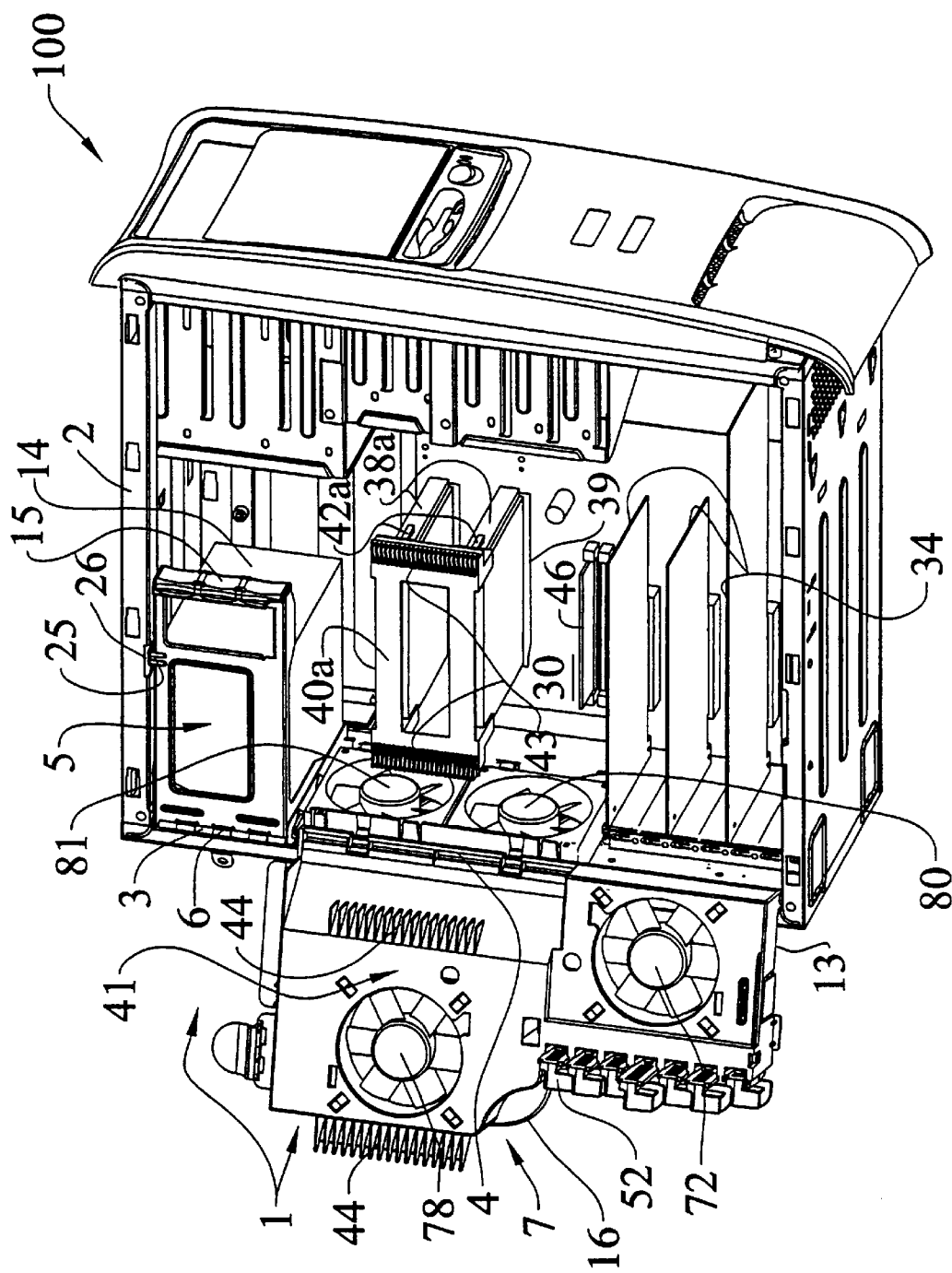
FIG. 2 is a perspective view of an embodiment of the computer system of the present invention with panel portions in a partially open position.

A circuit board retaining apparatus for securing a circuit board relative to a connector in a computer chassis 2 is illustrated in FIG. 2. The circuit boards specifically illustrate are computer processor packages that include a central processing unit and a circuit board. As a unit they are referred to below as "central processing units" or "processing units." However, the invention is equally applicable to other types of circuit boards and circuit board based components that can be retained in computer systems. The circuit board retaining apparatus includes a circuit board cap 40*a* that is coupled to the processing units 38*a*. The circuit board retaining apparatus also includes a retaining structure 41 coupled to the chassis 2. As illustrated, the retaining structure 41 is located on a side of the lower portion 7 of the panel 1. The retaining structure 41 engages with the circuit board cap 40*a* to secure the processing units 38*a* when the retaining structure 41 is in a first position as shown in FIG. 3. When the retaining structure 41 is in a second position, as is shown in FIG. 2, the retaining structure 41 is disengaged from the circuit board cap 40*a*.

Figure 11:
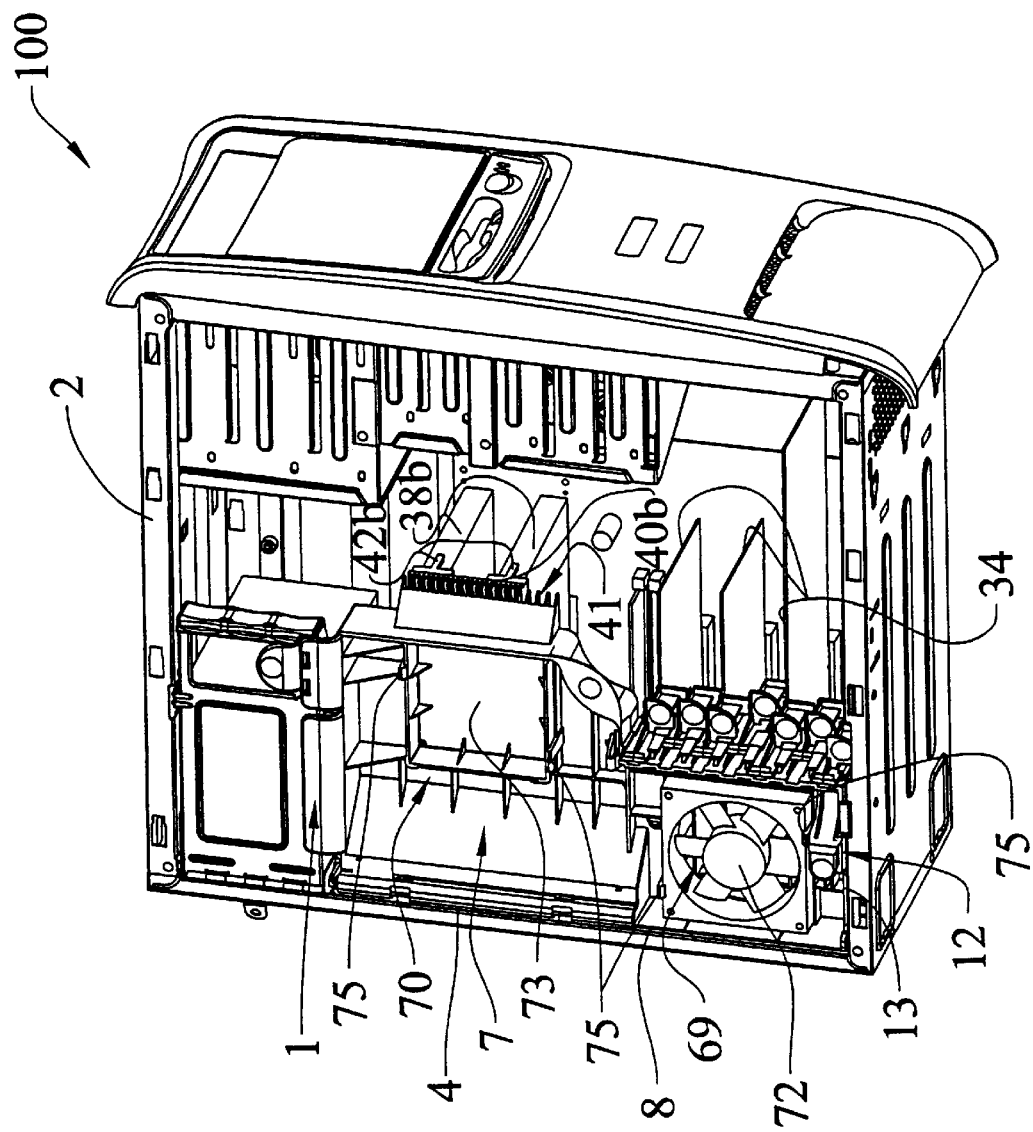
FIG. 11 is a perspective view of an embodiment of the computer system of the present invention with panel portions in a closed position.
Figure 12:
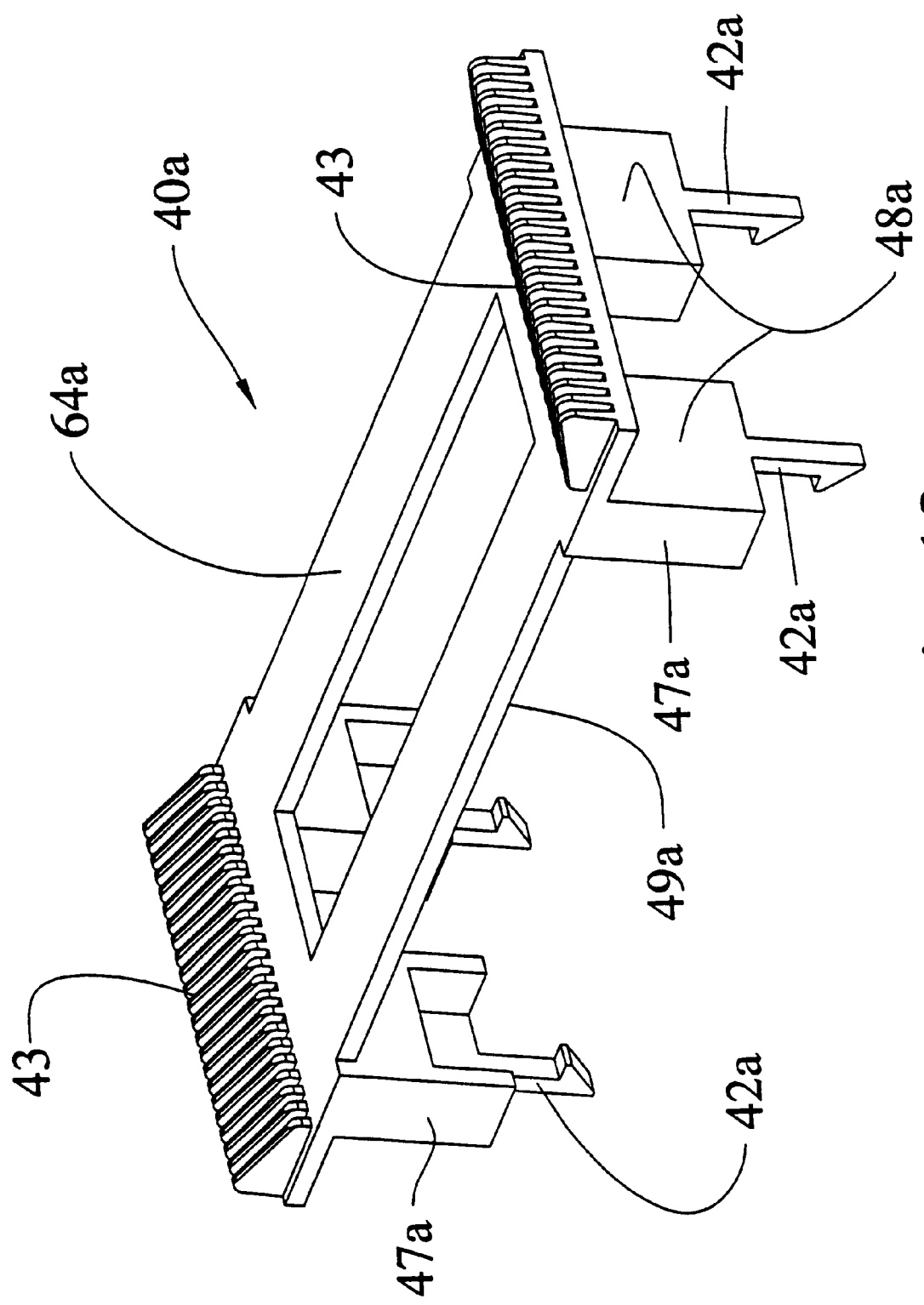
FIG. 12 is a perspective view of an embodiment of the circuit board cap of the invention.
Figure 13:
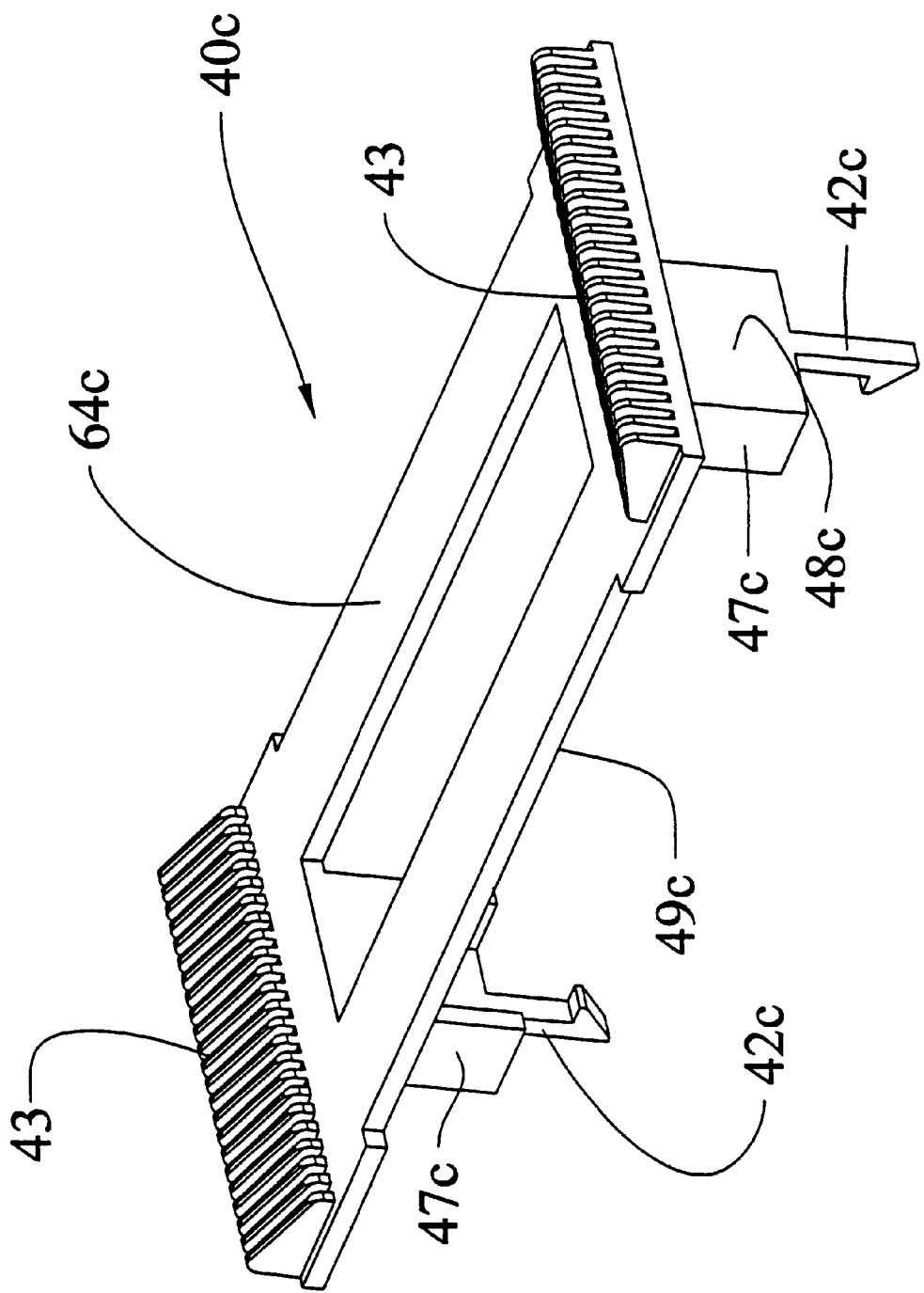
FIG. 13 is a perspective view of an embodiment of the circuit board cap of the invention.

The circuit board caps 40*a* and 40*b* shown in FIGS. 2, 3, 10–12, and 14 are capable of coupling with two circuit boards simultaneously. Alternatively, either may be used with a single circuit board. Another embodiment is illustrated in FIG. 13 where a circuit board cap 40*c* has only a single opening for coupling with a circuit board. As shown in FIGS. 2, 3, and 12, the circuit board cap 40*a* may include a hook 42*a* for hooking with a notch in the processing unit 38*a* to couple the circuit board cap 40*a* with the processing unit 38*a*. Similar hooks 42*b* and 42*c* may be employed with alternate embodiments of the circuit board cap as illustrated in FIGS. 10, 11, 13, and 14.

Each embodiment of the circuit board cap may include a first series of blades 43 for engaging with the retaining structure 41. In operation, the first series of blades 43 engages with a second series of blades 44 located on the retaining structure 41. As illustrated, the blades of the second series of blades 44 are spaced apart further than the blades of the first series of blades 43. Specifically, the blades in the second series of blades 44 are spaced apart two times further than the blades of the first series of blades 43. Additionally, in the illustrated embodiment the thicknesses of the blades of the first and second series of blades are substantially equivalent. Consequently, lateral alignment of the first series of blades 43 and a second series of blades 44 is adjustable by increments of the blade thickness. In other embodiments, spacing of the blades of the first series of blades 43 may be further apart than the spacing of the blades of the second series of blades 44. Other spacing and arrangements of the first and second series of blades that will substantially inhibit movement of the circuit board relative to the chassis in directions perpendicular to the claims of the blades are within the scope of the invention.

As illustrated in FIGS. 2, 3, 10, and 11 the retaining structure 41 is coupled to the chassis 2 through a hinge by virtue of the fact that it is located on the back of hinged panel 1. In other embodiments, the retaining structure 41 may be removably coupled to the chassis by means other than a hinge. Note also that the retaining structure 41 may be hooked and locked to the computer chassis 2 as described in embodiments of the panel above.

As illustrated in FIG. 2, the circuit board retaining apparatus, including a circuit board cap 40*a* and a retaining structure 41, may be a part of the computer system 100. The system also includes a computer chassis 2, and a first circuit board that is coupled to the computer chassis 2. The first circuit board of FIG. 2 is a motherboard 30 and also includes a socket 39. As shown, a power supply 14 is coupled to the computer chassis 2 and may be electrically connected to the first circuit board 30. A memory module 46 is connected to the motherboard 30. A second circuit board, i.e. processing unit 38*a*, may be connected to the motherboard 30 through at least the socket 39 of the motherboard 30. Specific embodiments of the circuit board cap 40*a* and the retaining structure 41 are consistent with the embodiments described above.

Figure 14:
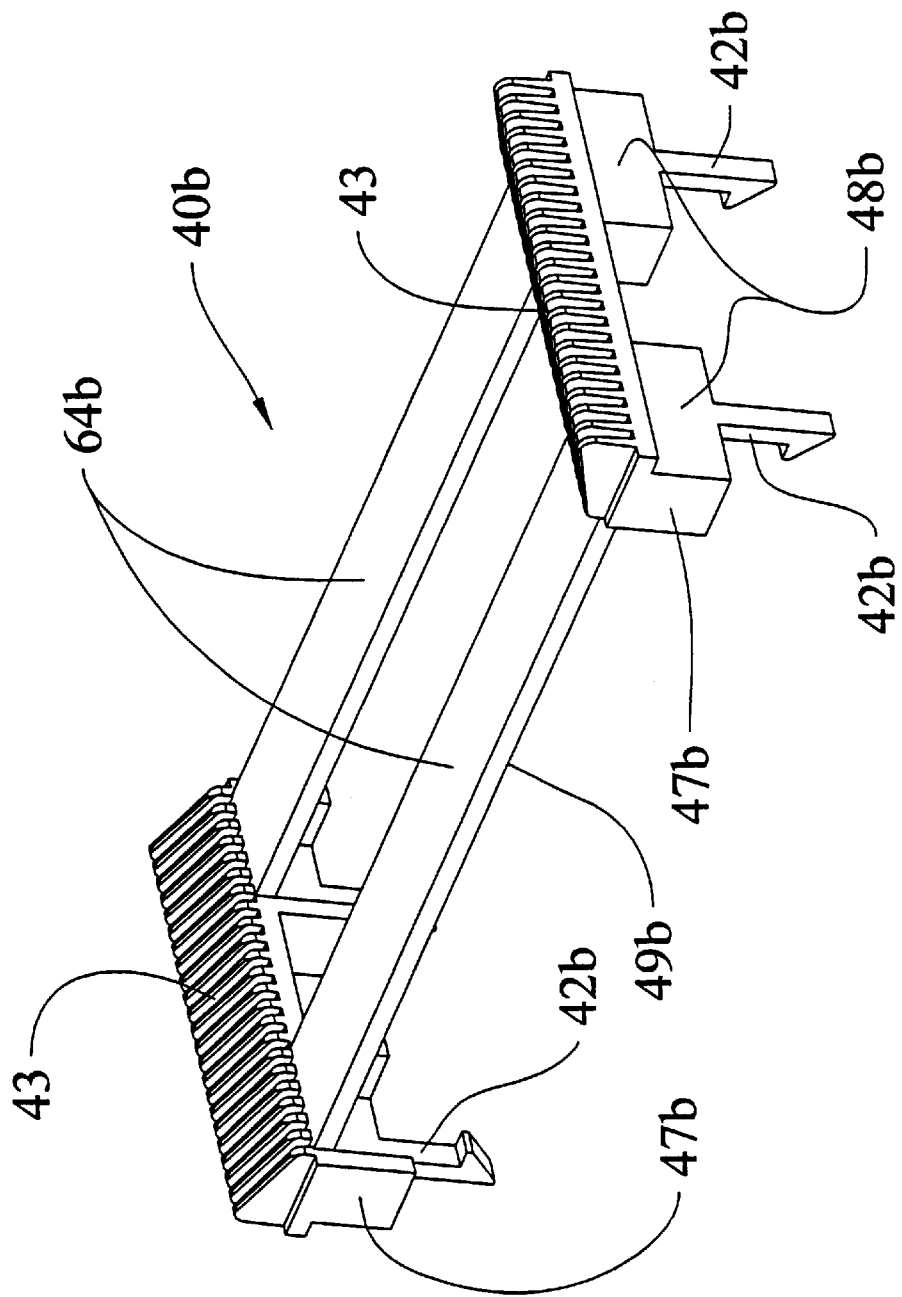
FIG. 14 is a perspective view of an embodiment of the circuit board cap of the invention.

Embodiments of the circuit board cap are more specifically illustrated in FIGS. 12–14. FIG. 12 illustrates a circuit board cap 40*a*. The circuit board cap 40*a* includes a first extension 47*a* from a first side 49*a* of the circuit board cap 40*a*. As drawn, the first side 49*a* is the bottom side of the circuit board cap 40*a*. The first extension 47*a* is for coupling to the processing unit 38*a* as shown in FIG. 2. This coupling restricts movement of the processing unit 38*a* relative to the circuit board cap 40*a*. Returning to FIG. 12, the circuit board cap 40*a* also includes a shear mechanism extending from a second side 64*a* of circuit board cap 40*a*. The second side 64*a* is on the opposite side of the circuit board cap 40*a* from the first side 49*a*. Although other embodiments could have shear mechanisms of different structures, the shear mechanism illustrated is the first series of blades 43. The shear mechanism, that is, the first series of blades 43, is for engaging with the retaining structure 41 as shown in FIG. 2. As described in more detail above, engagement of the first series of blades 43 can substantially inhibit movement of the circuit boards relative to the computer system chassis 2 in directions perpendicular to the plane of the blades.

FIGS. 12 and 14 illustrate embodiments of the invention where there are pairs of first extensions 47*a* and 47*b* extending from the first sides of the respective circuit board caps. In these embodiments, movement of the pairs of processing units is restricted by attachment of the respective circuit board caps. The embodiment of the circuit board cap illustrated in FIG. 13, on the other hand, provides a single first extension 47*c* for restricting a single processing unit 38*a*.

The circuit board cap 40*a* may also included a second extension 48*a* from the first side 49*a* for coupling to a circuit board to restrict movement of the circuit board cap 40*a* relative to the circuit board. The second extension 48*a* may also include a hook 42*a* for hooking with a notch in the processing unit 38*a* to more securely couple the processing unit 38*a* to the circuit board cap 40*a*. Similar hooks 42*c* and 42*b* are illustrated in the embodiments shown in FIGS. 13 and 14.

Another embodiment of the invention is a method of securing a second circuit board relative to a first circuit board in a computer system chassis. The first circuit board may be a motherboard 30. An act of the method is to open a panel of the computer system chassis, where the panel includes a retaining structure 41. FIG. 2 illustrates a system on which such a method may be performed. Another act of the method is to insert a second circuit board into a connector in the first circuit board. As shown in FIG. 2, the first circuit board is a motherboard 30 and the second circuit board is a processing unit 38*a*. The act of the method may include capping the processing unit 38*a* with a circuit board cap 40*a*. As illustrated in FIG. 12, the circuit board cap 40*a* includes a shear mechanism for engaging with the retaining structure 41. Closing the panel 1 to cause the retaining structure 41 of the panel 1 to engage the shear mechanism of the circuit board cap 40a will substantially inhibit movement of the processing unit 38a relative to the computer system chassis 2. As shown in FIG. 2, the act of opening the panel 1 of the computer system chassis 2 includes the act of pivoting the panel 1 about a hinge between the panel 1 and the computer system chassis 2. However, in other embodiments the method might involve attaching and detaching the panel 1 from the chassis 2 without the use of a hinge.

Expansion Board Retainer

Figure 15:
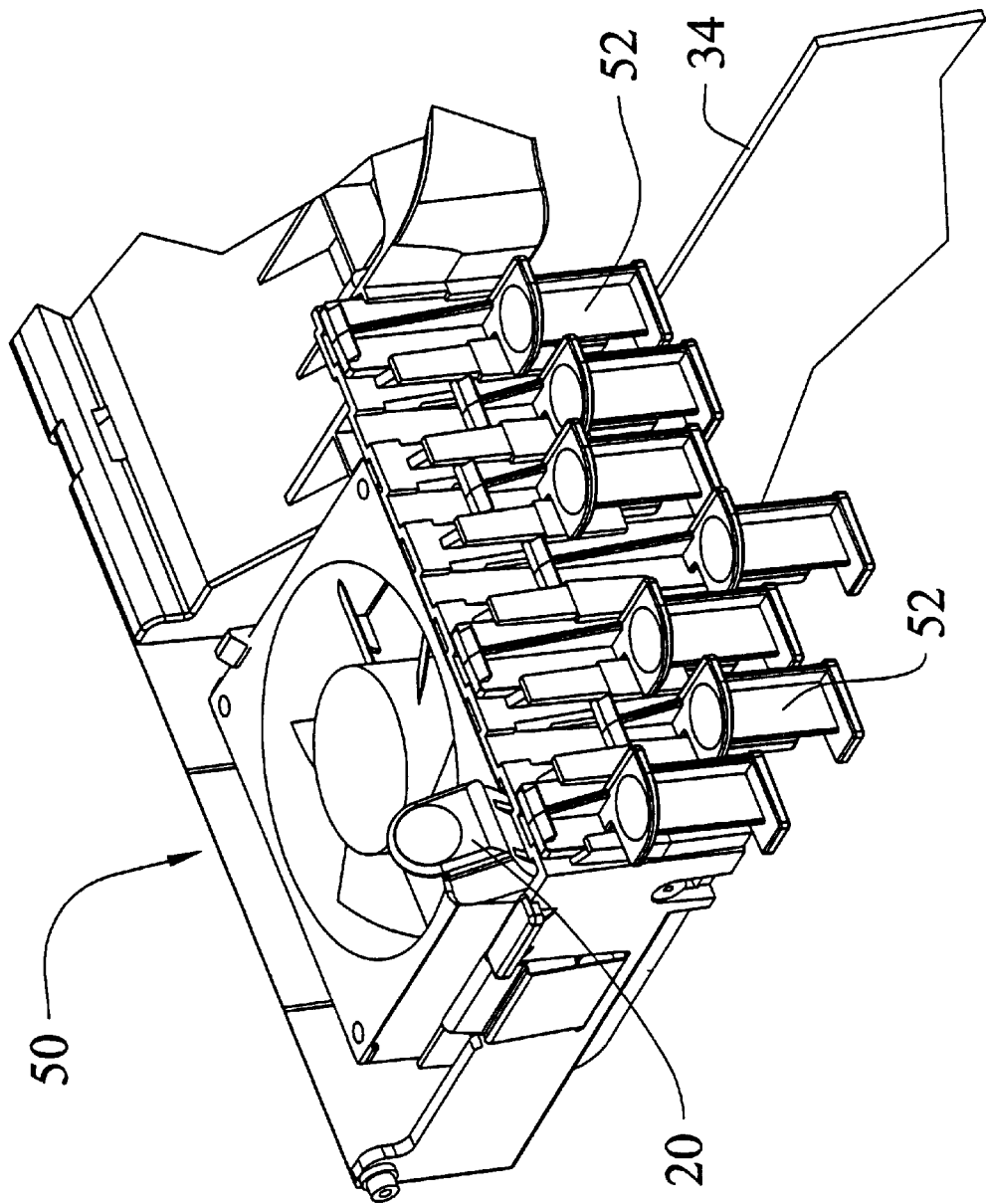
FIG. 15 is a perspective view of part of the lower portion of the panel of an embodiment of the present invention with panel portions including retaining members.
Figure 16:
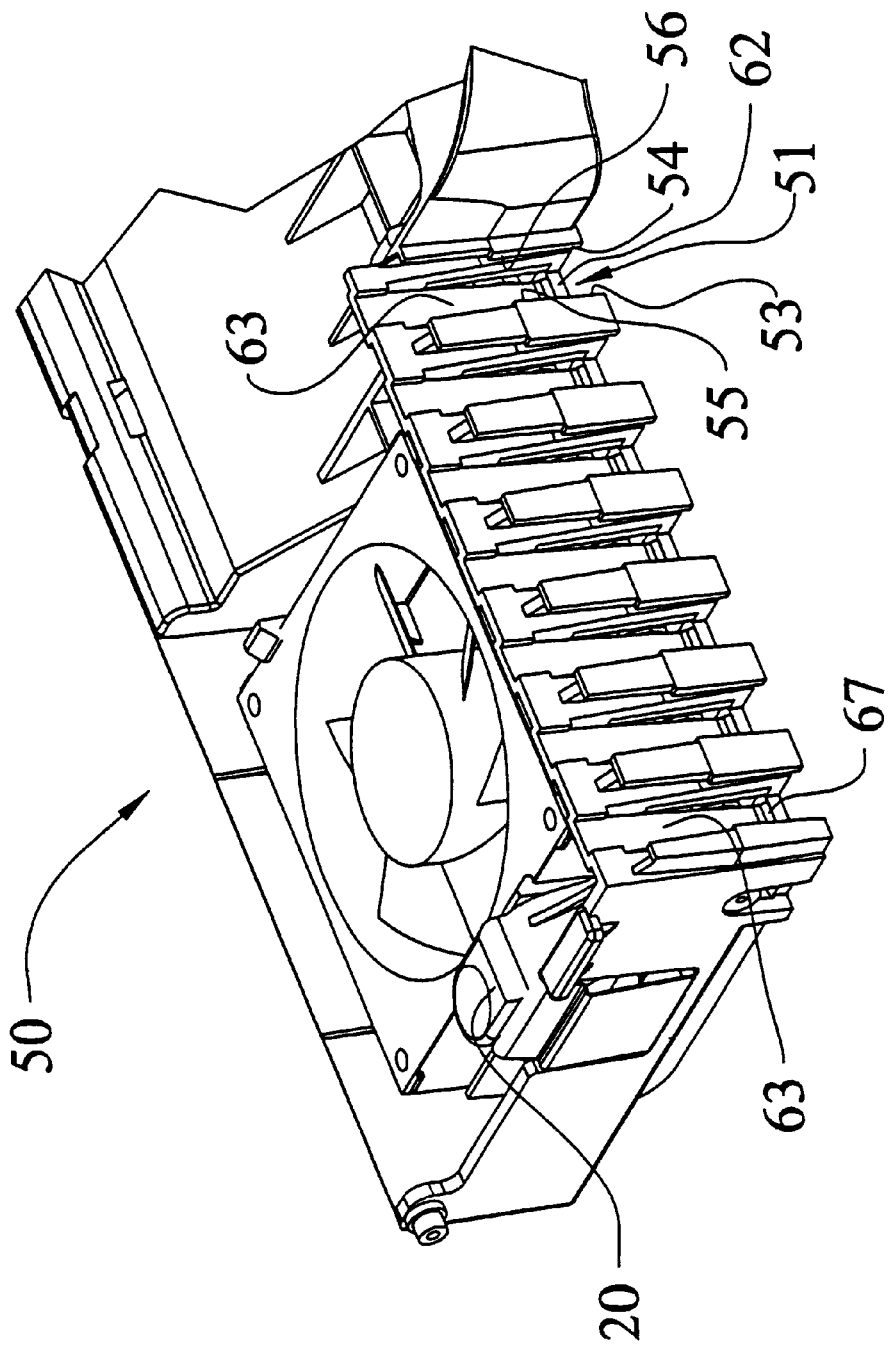
FIG. 16 is a perspective view of the lower portion of the panel of FIG. 15 locked and excluding retaining members.

A circuit board retaining apparatus 50 for retaining a circuit board 34 is illustrated in FIG. 3 in a computer system 100. Embodiments of the retaining apparatus 50 include a retaining structure such as the lower portion 7 that is coupled to the computer system chassis 2. As shown, the retaining structure is hinged from the chassis 2, but in other embodiments may be removably coupled to the chassis 2. A more detailed view of some components of the circuit board retaining apparatus 50 is presented in FIGS. 15 and 16. A channel 51 is illustrated in FIG. 16 along with a series of similar channels. FIG. 15 shows a card retaining member 52 coupled within the channel 51 such that the card retaining member 52 will slide in the channel 51. As illustrated, the circuit board 34 is retained by the retaining member 52 when the retaining member 52 is in a first position. The retaining member 52 is shown in the first position in FIG. 15. When the retaining member 52 is in a second position, the circuit board 34 is not retained. In the case of the circuit board 34 illustrated in FIG. 15, the second unretained position is a position where the retaining member 52 is located away from and above the circuit board 34. In some embodiments, the circuit board retained is a peripheral component interconnect (PCI) card.

Figure 17:
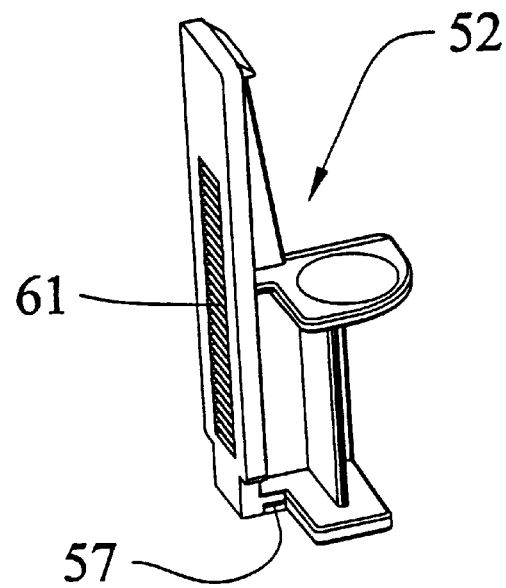
FIG. 17 is a perspective view of an embodiment of the retaining member of the invention.
Figure 18:
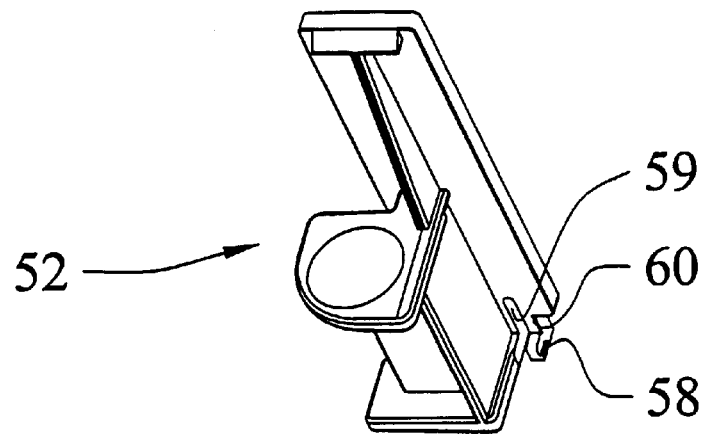
FIG. 18 is a perspective view of an embodiment of the retaining member of the invention also showing an embodiment of the relief cut.

FIG. 16 illustrates channel 51 with four surfaces 53, 54, 55, and 56. Surfaces 53 and 54 define a first end of the channel 51 that is wider than a second end of the channel 51 that is defined by surfaces 55 and 56. Because surfaces 55 and 56 are closer together than surfaces 53 and 54, an object that could pass freely between surfaces 53 and 54 may interfere with surfaces 55 and 56. This tapered portion of channel 51 is designed to prevent retaining member 52 from moving unimpeded from the channel 51 when a lower portion 5 of the panel 1 is inverted as shown in FIG. 1. Embodiments of the card retaining member 52 include at least one of protrusions 57 or 58, as illustrated in FIGS. 17 and 18, for interfering with the second end of the channel 51. The card retaining member 52 illustrated in FIG. 18 also includes a relief cut 59 for enhancing compression of a portion of the card retaining member 52 when the card retaining member is moved through the second end of the channel. That is, when the card retaining member 52 is compressed against the surfaces 55 and 56 of the channel 51, the leg 60 is allowed to flex toward the rest of the card retaining member 52 when the material of the relief cut 59 has been removed.

As illustrated in FIG. 17, the card retaining member 52 may include a plurality of ratchet teeth 61. As illustrated in FIGS. 15 and 16, the ratchet teeth are on the side of the card retaining member 52 adjacent to the trough 62 of the channel 51. The trough 62 of the channel 51 is illustrated in FIG. 16 and cannot be seen in FIG. 15 due to the placement of the card retaining member 52. As most easily seen in FIG. 16 the circuit board retaining apparatus 50 may also include a ratchet finger 63. The ratchet finger 63 is for engaging the ratchet teeth 61 of the card retaining member 52. Specifically, the ratchet finger 63 illustrated includes a pointed tip 67 that will engage with the ratchet teeth. The ratchet finger 63 illustrated extends through the trough 62. The ratchet finger 63 will engage the ratchet teeth 61 when the ratchet finger 63 is in a first position. The ratchet finger 63 illustrated in FIG. 16 is in the first position.

Figure 6:
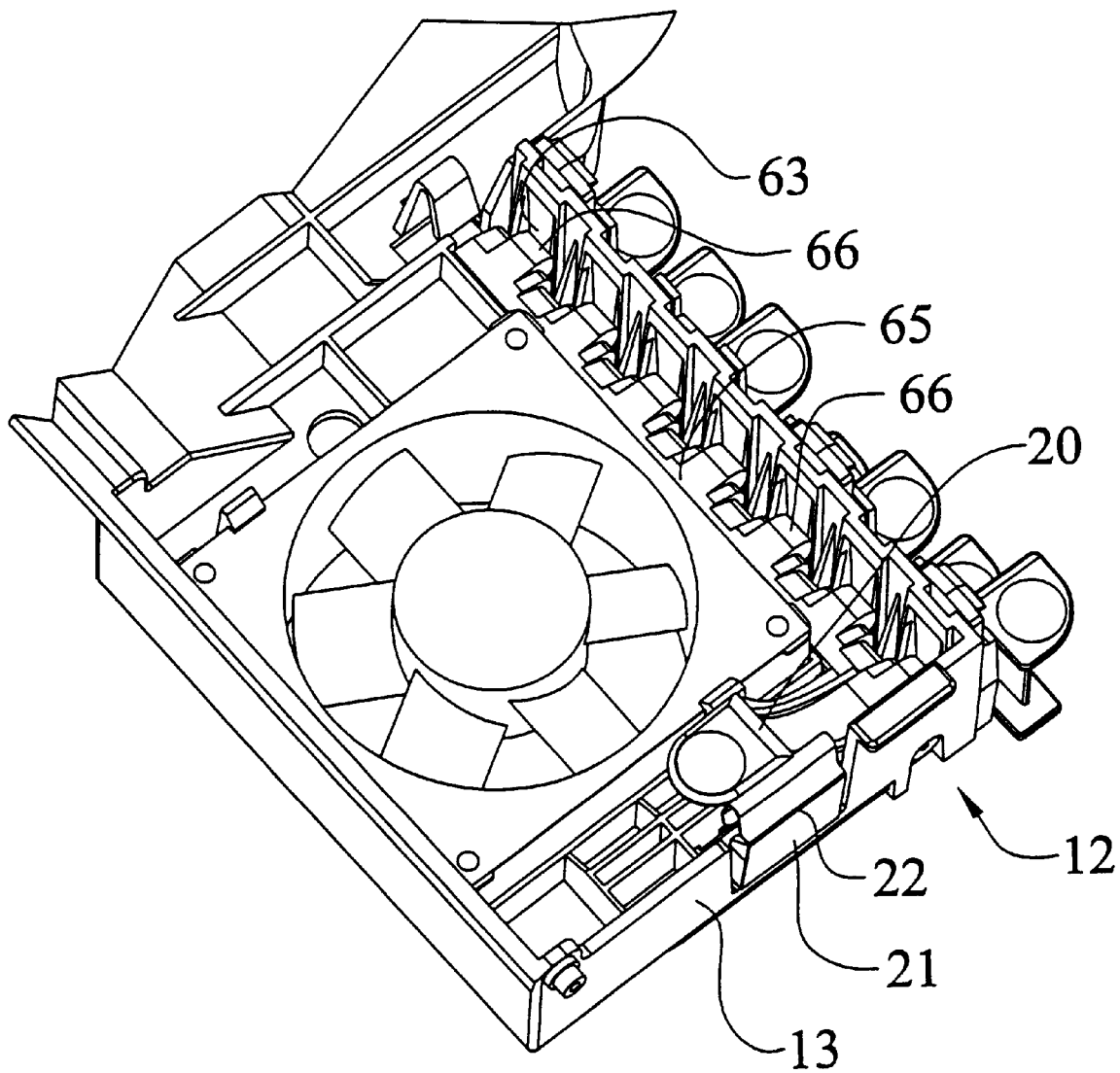
FIG. 6 is a perspective view of the part of the lower portion of the panel shown in FIG. 5 with the designator of the lock in a position that locks the panel.

As is more easily seen in FIGS. 5 and 6, the circuit board retaining apparatus may also have a designator 20 for urging ratchet finger 63 to a first position when the designator 20 is in a second position as shown in FIG. 6. In FIG. 5, the designator 20 is in a first position and the ratchet finger 63 is not in position to engage with the ratchet teeth 61 of the card retaining member 52. The designator 20 is coupled to a cam shaft 65 having cams 66 as illustrated in FIG. 6. The cams 66 are forced against the ratchet fingers 63 when the designator 20 is moved from the first position to a second position. FIG. 5 illustrates a first position of the designator 20 and FIG. 6 illustrates a second position.

The card retaining member 52 may be coupled with the remainder of the computer system 100 through the channel 51 as is discussed in detail above. In other embodiments, the card retaining member may be coupled through a hinged joint member or some other type of movable connection. Alternate embodiments may also include one way locking mechanisms including but not limited to the ratcheting embodiments described above.

Embodiments of the invention include a hinged panel, such as lower portion 7 illustrated in FIG. 3, that carries an expansion board retaining member 52 that is positioned away from the hinge 4 of the panel. Such embodiments are for retaining an expansion board 34 in connection with a motherboard 30 of the computer system 100. By rotating the lower portion 7 about the hinge 4 to a first position, as shown in FIG. 3, the expansion board 34 is held in connection with the motherboard 34. By rotating the lower portion 7 to a second position, as shown in FIG. 2, the expansion board is not secured by the expansion board retaining member 52, and an opening in the chassis 2 is created to allow access to internal components of the computer system 100. Although the expansion board retaining member 52 illustrated is an adjustable member, as described in various embodiments above, an expansion board retaining member may be fixed relative to the lower portion 7 in some embodiments. The expansion board retaining member may also fulfill the specifications for a member as detailed above.

The hinged panel may also include a lock mechanism 12 for securing a second edge 13 of the hinged panel. More in depth discussion and further embodiments of the lock mechanism are provided above.

An embodiment of the invention is a computer system 100 as shown in FIGS. 1–3. The system embodiment illustrated includes a computer chassis 2 to which a first circuit board is coupled. The first circuit board shown is a motherboard 30. The power supply 14 is coupled to the chassis 2 and electrically connected to the motherboard 30. The embodiment illustrated has an upper portion 5 of a hinged panel to which the power supply 14 is coupled. The power supply 14 may be coupled to the chassis 2 in a number of other ways, however, and remain within the scope of the invention. System embodiments may also include a memory module 46 that is connected to the motherboard 30. In addition, system embodiments may include second circuit boards such as expansion boards 34 that are connected to the motherboard through sockets in the motherboard. These expansion boards may be PCI cards. The expansion boards 34 may be held in connection with the motherboard 30 by card retaining members 52 that are coupled to a retaining structure such as lower portion 7 of panel 1. Embodiments of the card retaining members 52 and the retaining structure of the system are consistent with structures described in detail above.

Still another embodiment of the invention is a method of securing an expansion board, such as a PCI card, relative to a motherboard in a computer system chassis. One act of the method is to open a panel, such as a lower portion 7, of the computer system 100 as is illustrated in FIG. 2. The panel illustrated includes a card retaining member 52. As shown, the lower portion 7 is a panel that pivots about a hinge 4 such that the act of opening the panel includes pivoting it about the hinge. Another act is to insert an expansion board 34 into a connector of the motherboard 30. Yet another act of the method is to close the panel to cause the card retaining member 52 to align with an expansion board 34. This alignment is illustrated in FIG. 3. An act of the method also maybe to move the card retaining member toward the expansion board 34 until the card retaining member 52 engages the expansion board 34 to secure the expansion board 34 relative to the motherboard 30. In some embodiments of the invention, the method may also include locking the panel relative to the chassis 2 at some time after the act of closing the panel. Some such locks, once engaged, will only allow the card retaining member to be moved toward the expansion board 34.

Component Cooling System

Figure 20:
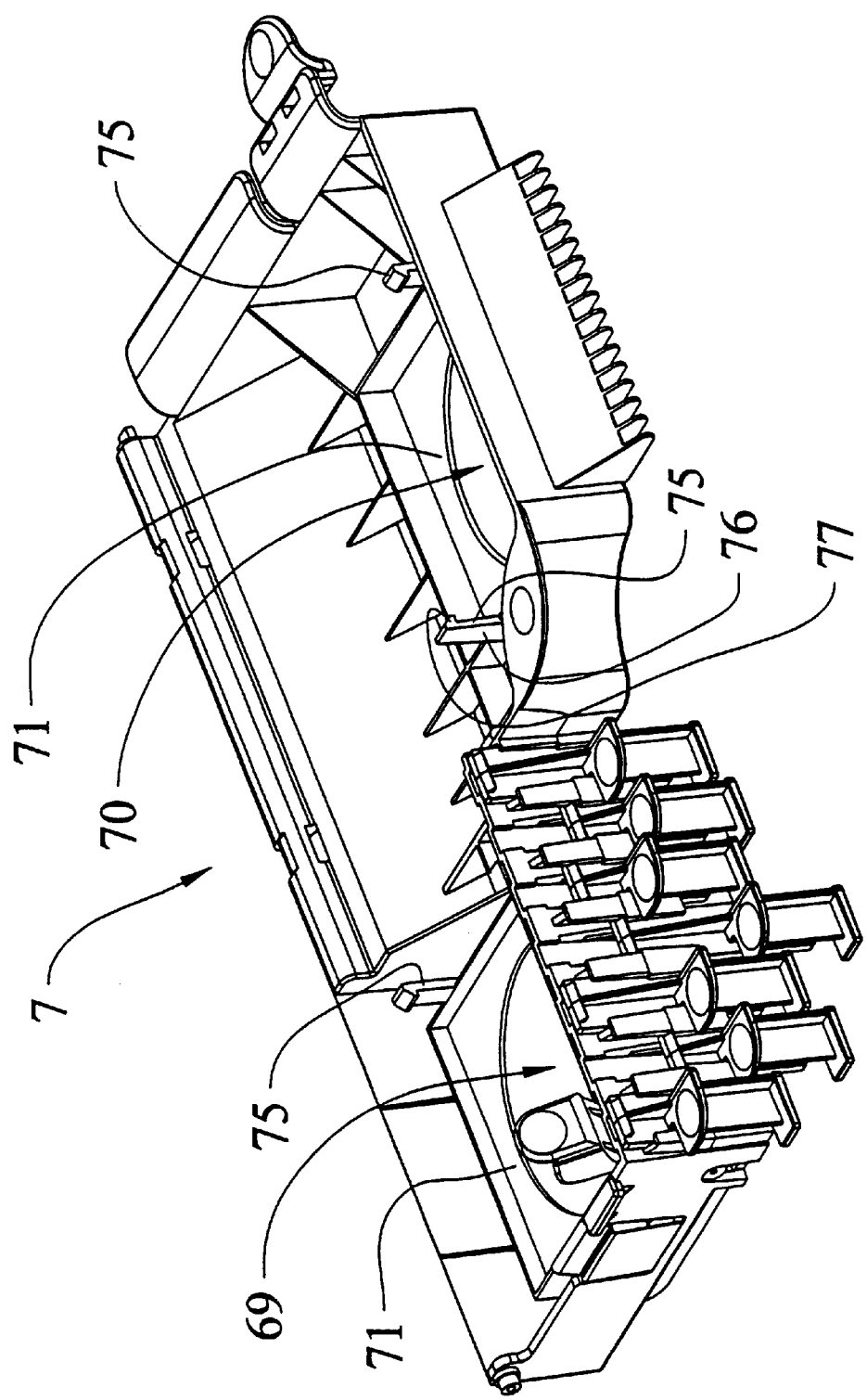
FIG. 20 is a perspective view of an embodiment of the lower portion of the panel of the invention.

An embodiment of the invention is a panel 1 that may include or be embodied by a lower portion 7 as shown in FIG. 2. The lower portion 7 is shown in a closed position in FIG. 3. In the closed position, a side cover (not shown for clarity) may be connected to the computer chassis 2 to enclose the lower portion 7, thereby causing the lower portion 7 to be interior to the side cover. The use of a side cover to enclose a computer chassis is well known in the art and need not be further described here. The panel 1 alone, or as embodied by the lower portion 7, may include a recessed portion such as first recessed portion 69 or second recessed portion 70 as shown in FIG. 20. Either recessed portion may distend away from a side cover of the computer to enable airflow between the side cover and the lower portion 7 when the side cover and panel are in place and closed respectively on the computer system 100. Embodiments of the lower portion 7 may also include a receptacle 71 in said first recessed portion 69 and/or the second recessed portion 70. The receptacle 71 is for accepting either a cooling fan or a receptacle cover. A first cooling fan 72 and a receptacle cover 73 are illustrated in FIG. 11.

In some embodiments, the panel 1 as a whole, or the lower portion 7 of the panel 1, may be detachable from the chassis 2. As illustrated in FIGS. 2 and 11, the lower portion 7 is coupled to the chassis 2 such that the lower portion 7 may be rotated along a hinge 4 on a first edge 8 of the lower portion 7. In other embodiments of the invention, the lower portion 7 may be coupled to the chassis 2 to rotate relative to the chassis 2 in some other manner. As illustrated in FIG. 3, the lower portion 7 also has a locked mechanism 12 for securing a second edge 13 relative to the computer chassis 2. As shown, the long dimension of the second edge 13 of the lower portion 7 is substantially perpendicular to the axis of the hinge 4.

As illustrated in FIG. 11, the second recessed portion 70 is adjacent to at least one processing unit 38b. In the same embodiment, or in an alternate embodiment, a recessed portion may also be adjacent to an expansion board area of a computer system. FIG. 11 shows a first recessed portion 69 containing a first cooling fan 72 and adjacent to an expansion board area where expansion boards 34 are placed. One or more of such expansion boards 34 may be PCI expansion boards.

FIGS. 11 and 20 also show a securing mechanism 75 for securing to or releasing from either a cooling fan 72 or a receptacle cover 73. As may be seen in FIG. 20, the securing mechanism may include a tab 76 that extends away from the lower portion 7 to capture a portion of a fan or a receptacle cover. The securing mechanism shown includes a barb 77 for capturing a portion of a fan or a receptacle cover. Other embodiments may hook other portions of a fan or receptacle cover with the barb 77, or may secure a fan or a receptacle cover through compression, friction, or in any other functional manner.

In the embodiment of the invention illustrated in FIGS. 2 and 3, the lower portion 7 supports two cooling fans so that a second cooling fan 78 is adjacent to at least one processing unit 38a, and a first cooling fan 72 is supported adjacent to an expansion board area. In alternate embodiments, the second cooling fan 78 may be adjacent to the expansion board area and a first cooling fan 72 may be adjacent to at least one processing unit. Additionally, either or both of the receptacles of first recessed portion 69 or second recessed portion 70 may contain a receptacle cover 73. FIG. 11 shows a receptacle cover 73 in the second recessed portion 70.

Receptacle covers may be employed to block air flow and cooling fans may be used to create air flow in a cooling system for a computer. By selectively using either fans or covers, air flow may be directed to only the portions of a computer system necessary to establish adequate cooling. FIG. 2 shows a computer system with first cooling fan 72 and second cooling fan 78 in lower portion 7 of the panel 1. These two fans may be referred to as panel fans since they are supported by the lower portion 7 of the panel 1. FIG. 2 also shows a third cooling fan 80 and a fourth cooling fan 81 supported on a wall of the computer chassis 2. These fans may therefore be called chassis fans.

Figure 19:
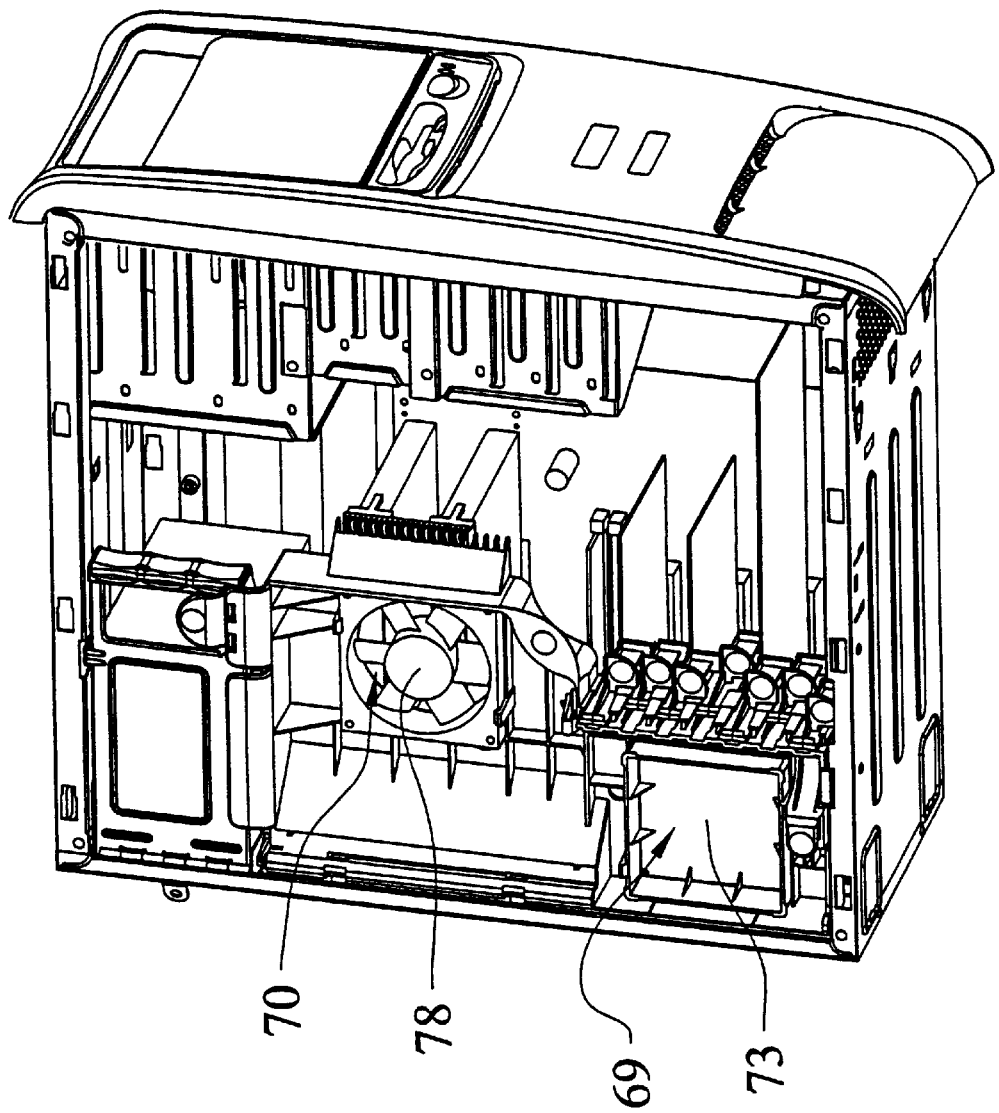
FIG. 19 is a perspective view of an embodiment of the computer system of the present invention with panel portions in a closed position.

A cooling system then may include a panel fan supported on a panel that is operable to locate the panel fan adjacent to a component of the computer when the panel is in a closed position as is shown in FIG. 3. The panel may also be operable to locate the panel fan exterior to the computer when the panel is in an open position as illustrated in FIG. 2. FIG. 2 shows the chassis fans coupled to an exterior wall of the computer. The panel fans and the chassis fans in this arrangement may work cooperatively as a cooling system for the computer system 100. Any of cooling fans 72, 78, 80, or 81 may be replaced by a receptacle cover 73 to tune the airflow in the computer system 100. Additionally, the directions of any of cooling fans 72, 78, 80, or 81 may be reversed to tune the airflow in the computer system 100. FIG. 1 shows two receptacle covers 73 in the first and second recessed portions (only partially visible because on the other side of the panel 1). FIG. 3 shows the first cooling fan 72 in the first recessed portion 69, and the second cooling fan 78 in the second recessed portion 70. FIG. 11 shows the first cooling fan 72 in the first recessed portion 69, and a receptacle cover 73 in the second recessed portion 70. FIG. 19 shows a receptacle cover 73 in the first recessed portion, and the second cooling fan 78 in the second recessed portion 70.

In some embodiments of the cooling system, one or more chassis fans, such as fans 80 and 81, directly remove air from the computer system 100 adjacent to the chassis fans. One or more chassis fans may also be used to pull air into the computer system 100 adjacent to the chassis fans. In cooperation with the chassis fans, the panel fans, such as fans 72 and 78, may be used to move air interior to the computer system 100. For instance, the panel fans may move air over computer components like processors 38a or expansion boards 34 as shown in FIG. 2.

Another embodiment of the invention is a computer system 100 as illustrated in FIG. 3. The computer system 100 shown has a computer chassis 2 and a motherboard 30 that is coupled to the chassis 2. The computer system 100 also has a power supply 14 coupled to the chassis 2 through an upper portion 5 of the panel 1. The power supply 14 is also electrically connected to the motherboard 30 through an electrical connector (not shown). The system 100 illustrated has a memory module 46 coupled to the motherboard 30 through a socket in the motherboard. One or more processing units 38 may also be coupled to the motherboard 30 through one or more sockets of the motherboard. In addition, the system may include one or more expansion boards 34 coupled to the motherboard 30 through one or more sockets in the motherboard. A feature of the illustrated embodiment of the invention is a panel 1 coupled to the chassis 2. The features and variations of the panel 1 in structure and in supporting cooling fans or receptacles are consistent with the features and variations of the panel 1 and lower portion 7 described in detail above.

Still another embodiment of the invention is a method of cooling components of a computer system. Components may include such elements as processors 38a, expansion boards 34, memory modules 46, a power supply 14, and other components typically found in a computer system. One act of the method is to draw air into the computer system 100 with a chassis fan such as the third cooling fan 80 or the fourth cooling fan 81 shown in FIG. 2. Another act of the method may be to move the air drawn into the computer system 100 over one or more of the components of the system by moving air with a panel fan through a panel 1 that is between the components and a side wall of the computer system. The first cooling fan 72 and the second cooling fan 78 are illustrative of panel fans used in the method. In some embodiments of the method, air is pushed toward one or more components with a cooling fan. In other embodiments, air is pulled past one or more components with a cooling fan.

From the foregoing it will be appreciated that, although specific embodiments of the invention have been described herein for purposes of illustration, various modification may be made without deviating from the spirit and scope of the invention. Accordingly, the invention is not limited except as by the claims.

What is claimed is:

1. A panel hingedly attached to a computer chassis for supporting components of a computer system, said panel comprising:
   an upper portion with a first hinge along a first edge of said upper portion;
   a lower portion with a second hinge along a first edge of said lower portion, the axis of the second hinge being oriented along an axis substantially parallel with the axis of the first hinge, said lower portion being detachably interconnectable with said upper portion; and
   a first lock mechanism for securing a second edge of said panel relative to the computer chassis, the long dimension of the second edge of said panel being substantially perpendicular to the axes of the first and second hinges.

2. The panel of claim 1 wherein a component supported by said panel is a computer power supply.

3. The panel of claim 1 wherein said upper portion includes a handle for lifting and rotating said upper portion relative to the computer chassis.

4. The panel of claim 1 wherein said lower portion includes a hook catch for interconnecting with said upper portion.

5. The panel of claim 4 wherein the hook catch includes a lift tab for lifting to disengage the hook catch of said lower portion from said upper portion.

6. The panel of claim 1 wherein said first lock mechanism comprises:
   a designator positionable in a first position and a second position, and
   a locking tab that is displaced by the designator to engage the computer chassis and restrict movement of said panel relative to the computer chassis when the designator is in the second position.

7. The panel of claim 1 wherein said panel includes a second lock mechanism for securing a third edge of said panel relative to the computer chassis, the third edge being located opposite from the second edge.

8. The panel of claim 1 wherein said upper portion includes a side extending from the primary plane of said panel such that two sides of a computer component are contacted by said upper portion when the computer component is supported by said upper portion.

9. The panel of claim 1 wherein a component supported by said upper portion is a computer power supply.

10. A computer component securing apparatus comprising:
    a computer chassis;
    a panel hingedly coupled to said chassis, said panel comprising:
       an upper portion with a first hinge along a first edge of the upper portion,
       a lower portion with a second hinge along a first edge of the lower portion, the axis of the second hinge being oriented along substantially the same axis as the first hinge, the lower portion being detachably interconnectable with the upper portion, and
       a first lock mechanism for securing a second edge of said panel relative to the computer chassis, the long dimension of the second edge of said panel being substantially perpendicular to the axes of the first and second hinges; and
    a component coupled to said panel that is removable from said computer chassis by rotating said panel out of said computer chassis.

11. The computer component securing apparatus of claim 10 wherein the upper portion includes a side extending from the primary plane of said panel such that two sides of a computer component are contacted by the upper portion when the computer component is supported by the upper portion.

12. The computer component securing apparatus of claim 10 wherein the upper portion includes a handle for lifting and rotating said upper portion relative to the computer chassis.

13. The computer component securing apparatus of claim 10 wherein the lower portion includes a hook catch for interconnecting with the upper portion.

14. The computer component securing apparatus of claim 13 wherein the hook catch includes a lift tab for lifting to disengage the hook catch of said lower portion from said upper portion.

15. The computer component securing apparatus of claim 10 wherein the first lock mechanism comprises:
    a designator positionable in a first position and a second position, and a locking tab that is displaced by the designator to engage the computer chassis and restrict movement of said panel relative to said computer chassis when the designator is in the second position.

16. The computer component securing apparatus of claim 10 wherein the component coupled to said panel is a computer power supply.

17. The computer component securing apparatus of claim 10 wherein said component supported by the upper portion is a computer power supply.

18. The computer component securing apparatus of claim 10 further comprising a second lock mechanism for securing a third edge of said panel relative to the computer chassis, the third edge being located opposite from the second edge.

19. The computer component securing apparatus of claim 10 further comprising a grommet coupled to said computer chassis for frictionally engaging said panel to restrict said panel from moving freely relative to the computer chassis and damaging said panel or injuring an operator of said panel.

20. The computer component securing apparatus of claim 10 further comprising a grommet coupled to the computer chassis for frictionally engaging the upper portion to restrict the upper portion and a component held by the upper portion from moving freely relative to the computer chassis and damaging the component or upper portion, or injuring an operator of the upper portion.

21. A computer system comprising:

a computer chassis;

a motherboard coupled to said computer chassis;

a computer component coupled to said motherboard; and a means for removably securing said computer component within said computer chassis.

22. The computer system of claim 21 further comprising a means for locking a computer component in the computer system at an operational location.

23. A method of securing a computer component in a computer system comprising the acts of:

opening a hinged panel coupled along an edge of a computer system;

inserting a first computer component through a space provided by the opened panel into the computer system;

coupling a second computer component to the hinged panel; and closing the hinged panel to:
secure the first computer component in the computer system, and
position the second computer component at an operational location in the computer system.

* * * * *